(12) United States Patent
Xie et al.

(10) Patent No.: US 10,014,389 B2
(45) Date of Patent: Jul. 3, 2018

(54) METHODS OF FORMING IC PRODUCTS COMPRISING A NANO-SHEET DEVICE AND A TRANSISTOR DEVICE HAVING FIRST AND SECOND REPLACEMENT GATE STRUCTURES

(71) Applicant: GLOBALFOUNDRIES Inc., Grand Cayman (KY)

(72) Inventors: Ruilong Xie, Niskayuna, NY (US); Chanro Park, Clifton Park, NY (US); Min Gyu Sung, Latham, NY (US); Hoon Kim, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 55 days.

(21) Appl. No.: 15/219,403

(22) Filed: Jul. 26, 2016

(65) Prior Publication Data
US 2018/0033871 A1    Feb. 1, 2018

(51) Int. Cl.
*H01L 29/66* (2006.01)
*H01L 29/06* (2006.01)
*H01L 29/165* (2006.01)
*H01L 21/02* (2006.01)
*H01L 21/308* (2006.01)

(52) U.S. Cl.
CPC .. *H01L 29/66545* (2013.01); *H01L 21/02532* (2013.01); *H01L 21/3086* (2013.01); *H01L 29/0673* (2013.01); *H01L 29/165* (2013.01); *H01L 29/66795* (2013.01)

(58) Field of Classification Search
CPC .......... H01L 21/3086; H01L 21/02532; H01L 29/66545; H01L 29/66795
See application file for complete search history.

(56) References Cited

U.S. PATENT DOCUMENTS

| 2015/0279935 | A1* | 10/2015 | Xie | H01L 29/0847 257/410 |
| 2016/0118480 | A1* | 4/2016 | Xie | H01L 29/66795 257/347 |
| 2017/0278842 | A1* | 9/2017 | Song | H01L 27/0617 |

* cited by examiner

*Primary Examiner* — Michael Jung
(74) *Attorney, Agent, or Firm* — Amerson Law Firm, PLLC

(57) ABSTRACT

One illustrative method disclosed herein includes, among other things, forming channel semiconductor material for a nano-sheet device and a transistor device, forming a device gate insulation layer on both the nano-sheet device and on the transistor device, and forming first and second sacrificial gate structures for the nano-sheet device and the transistor device. In this example, the method also includes removing the sacrificial gate structures so as to define, respectively, first and second gate cavities, wherein the device gate insulation layer is exposed within each of the gate cavities, removing the device gate insulation layer for the transistor device from within the first gate cavity while leaving the device gate insulation layer in position within the second gate cavity, and forming first and second replacement gate structures in the first and second gate cavities, respectively.

22 Claims, 28 Drawing Sheets

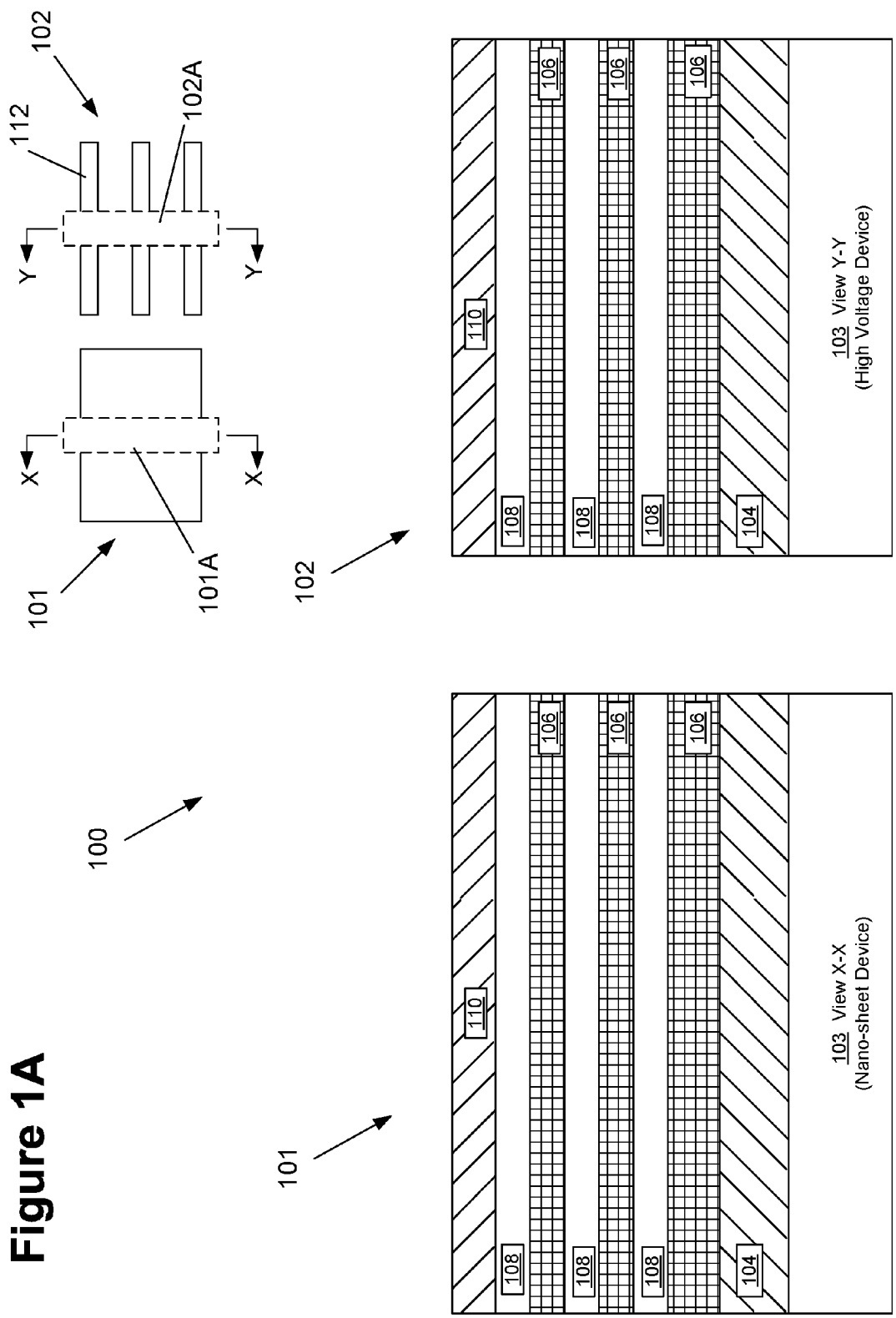

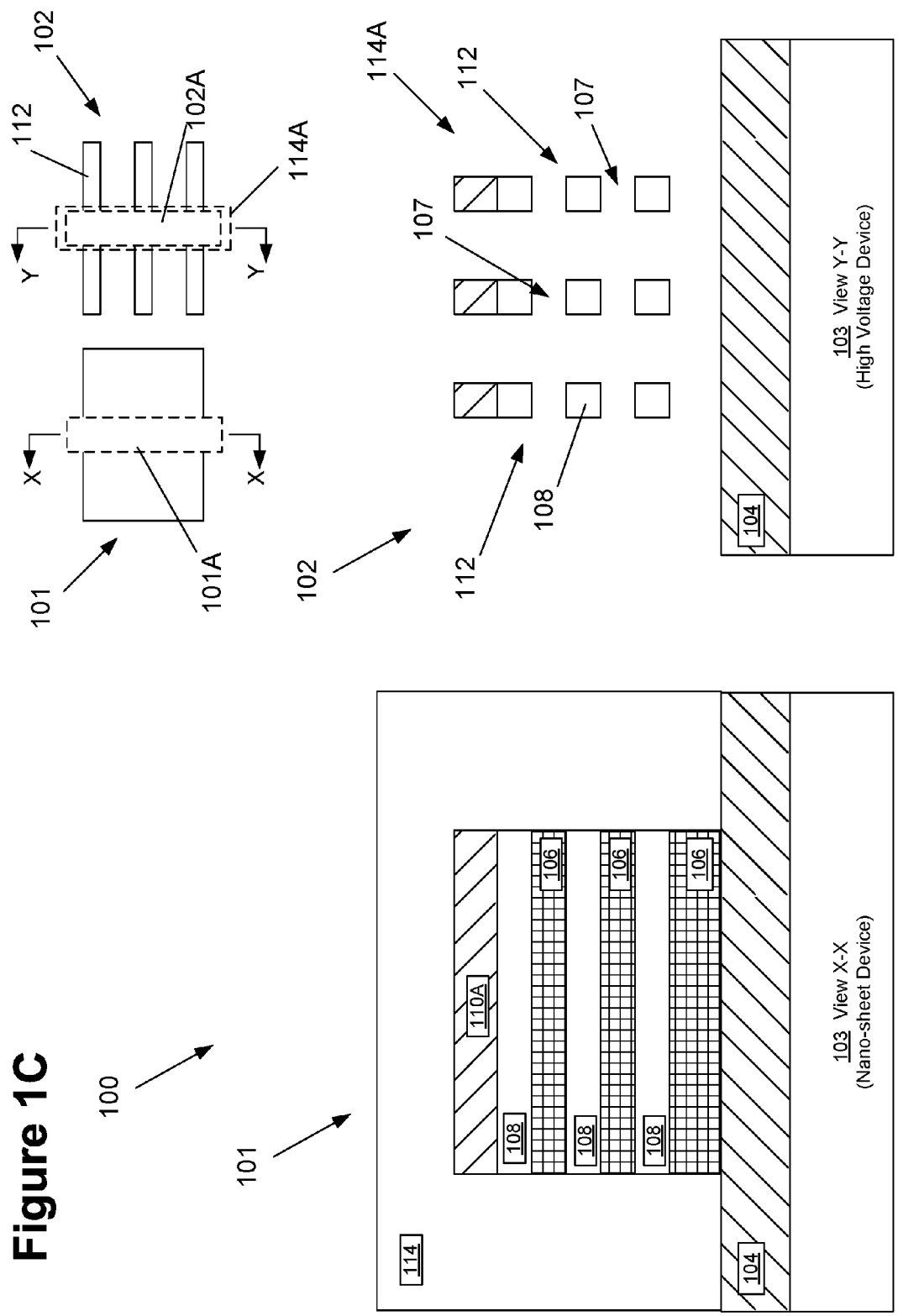

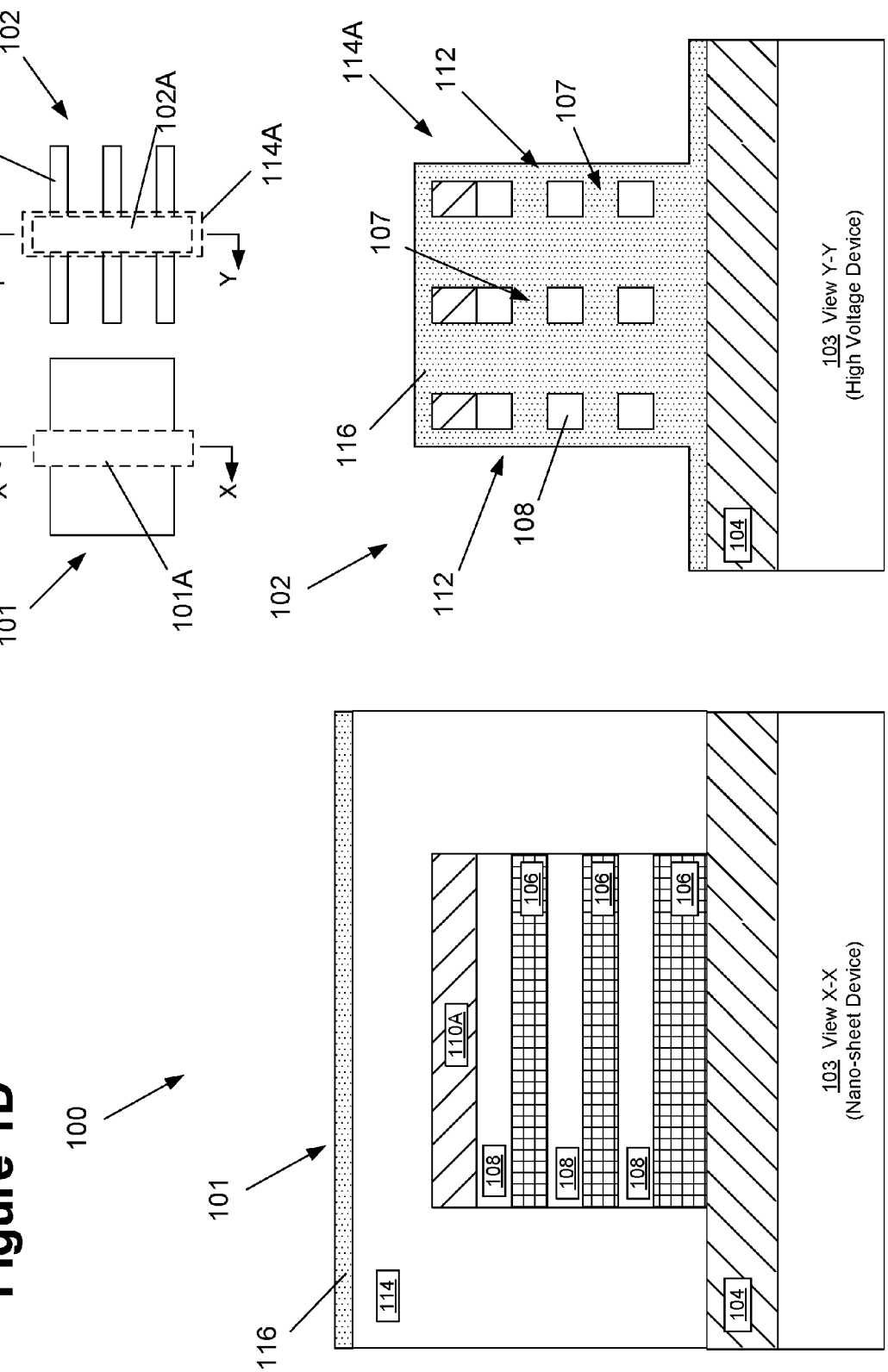

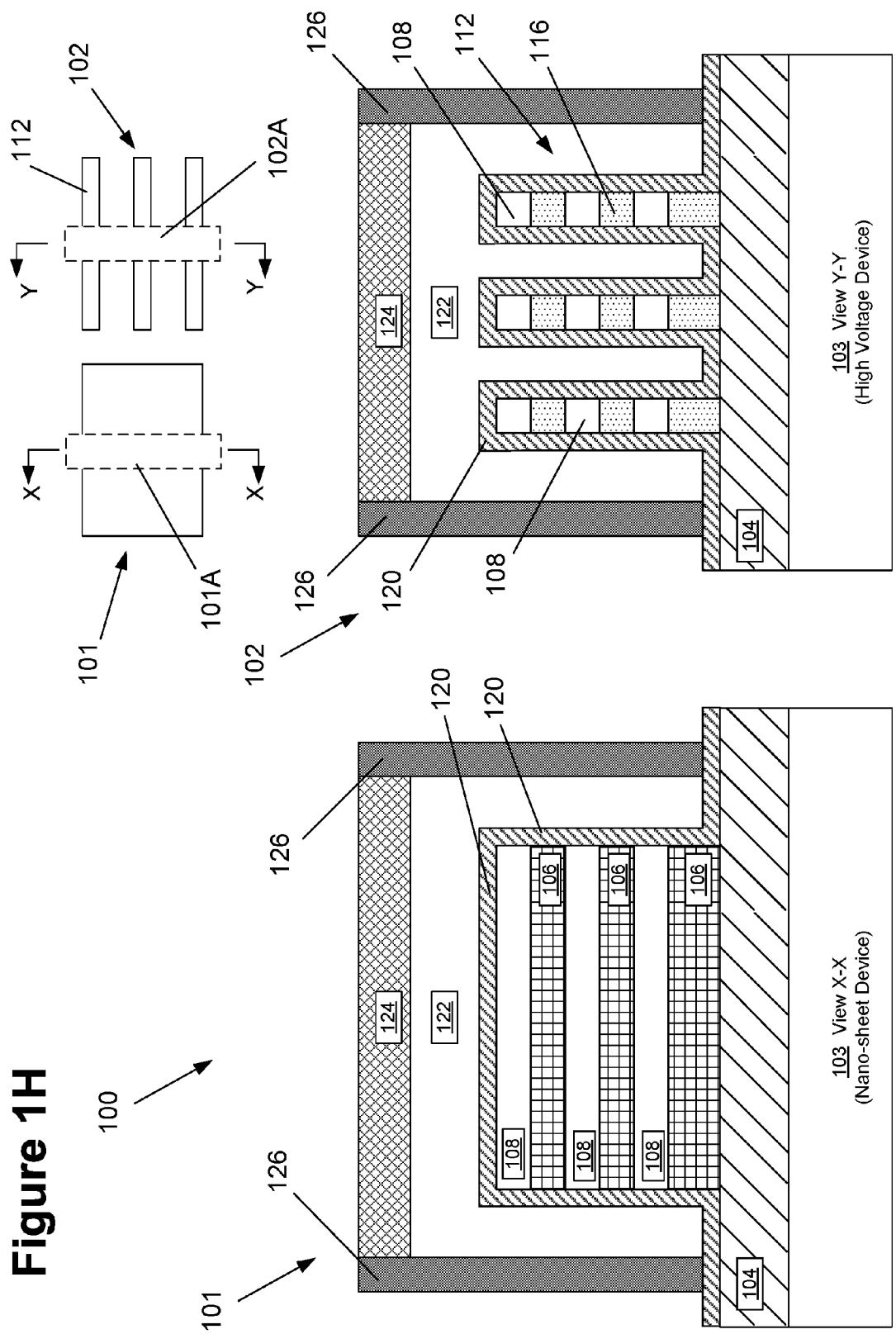

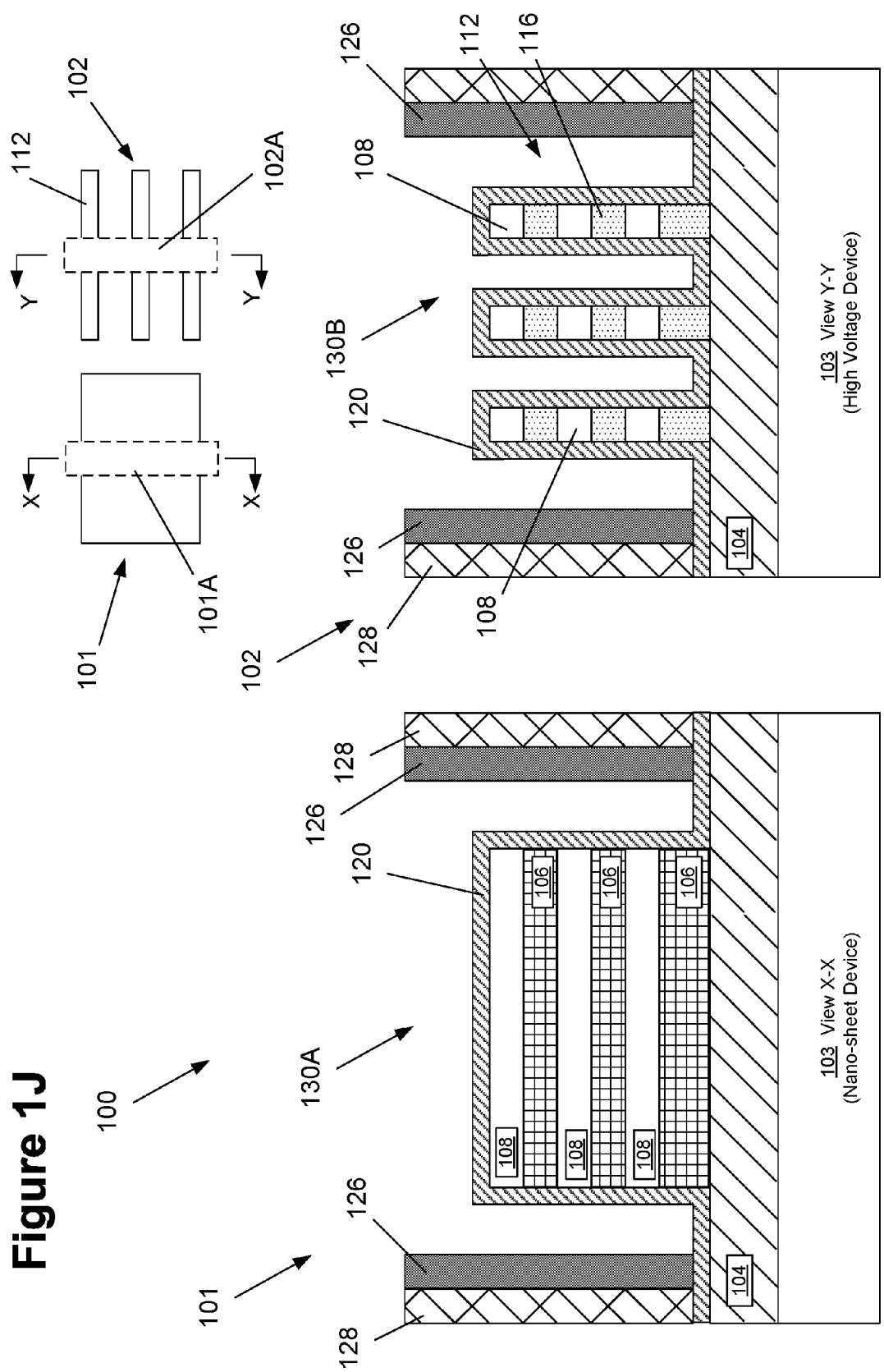

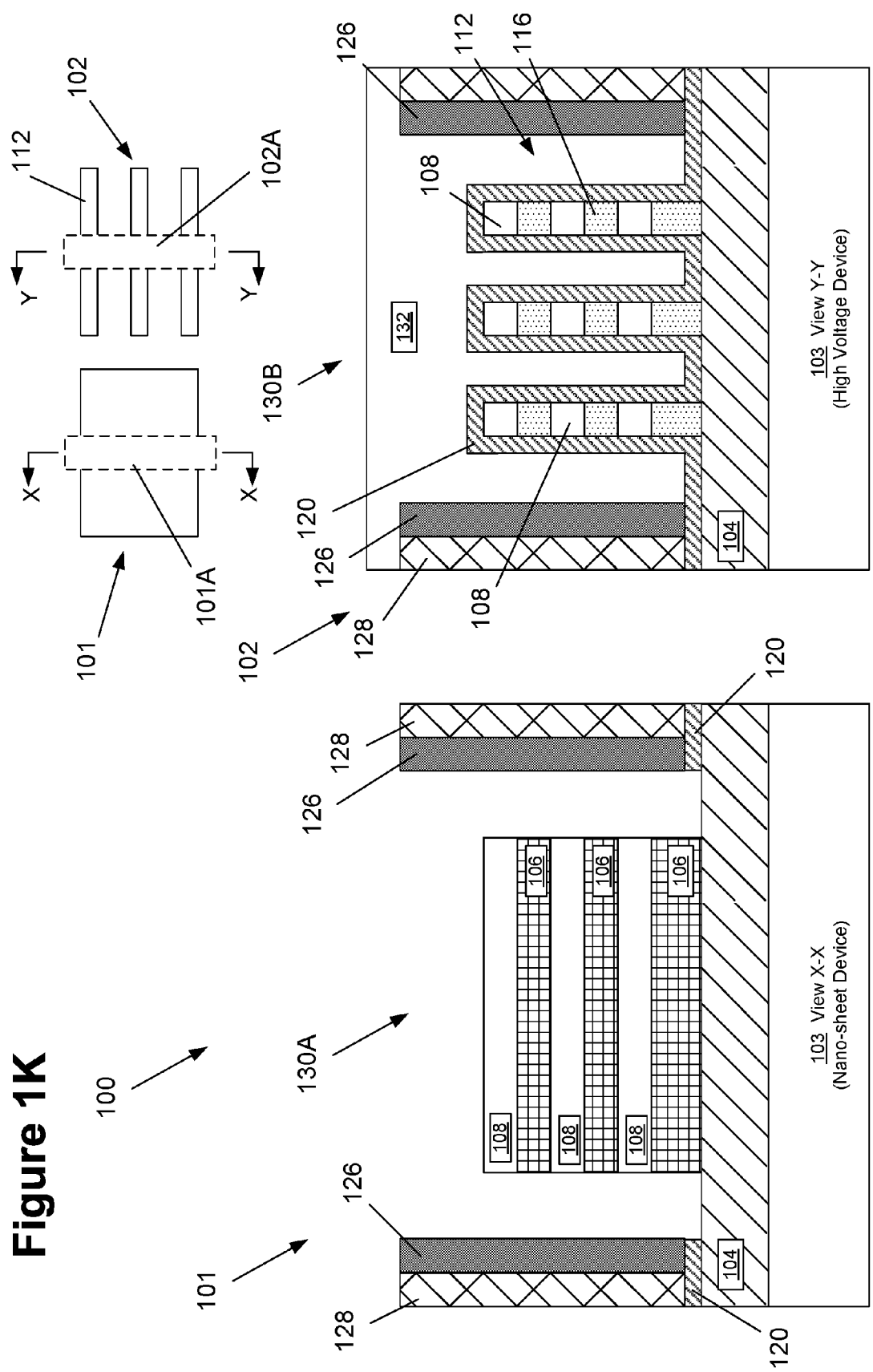

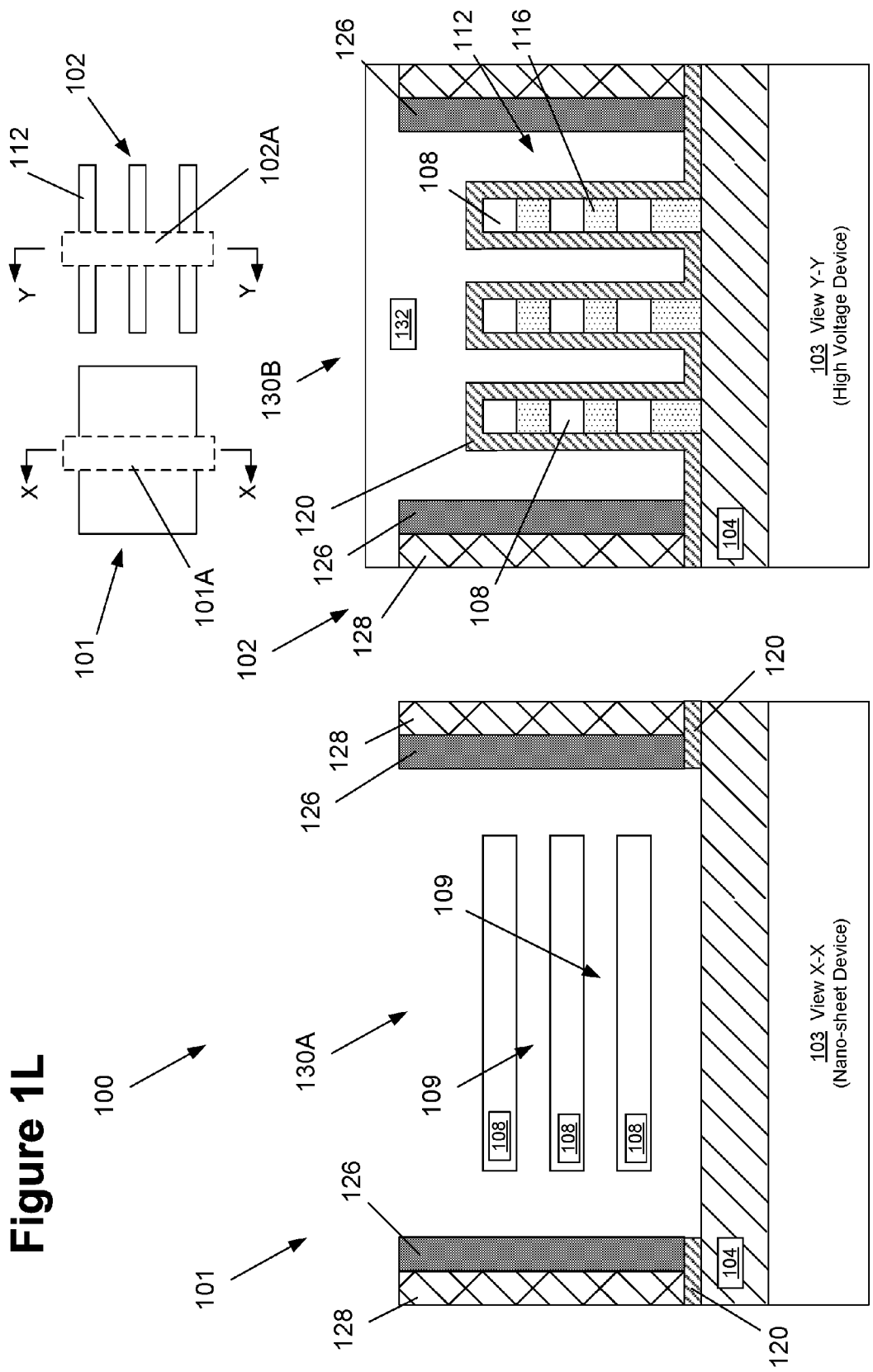

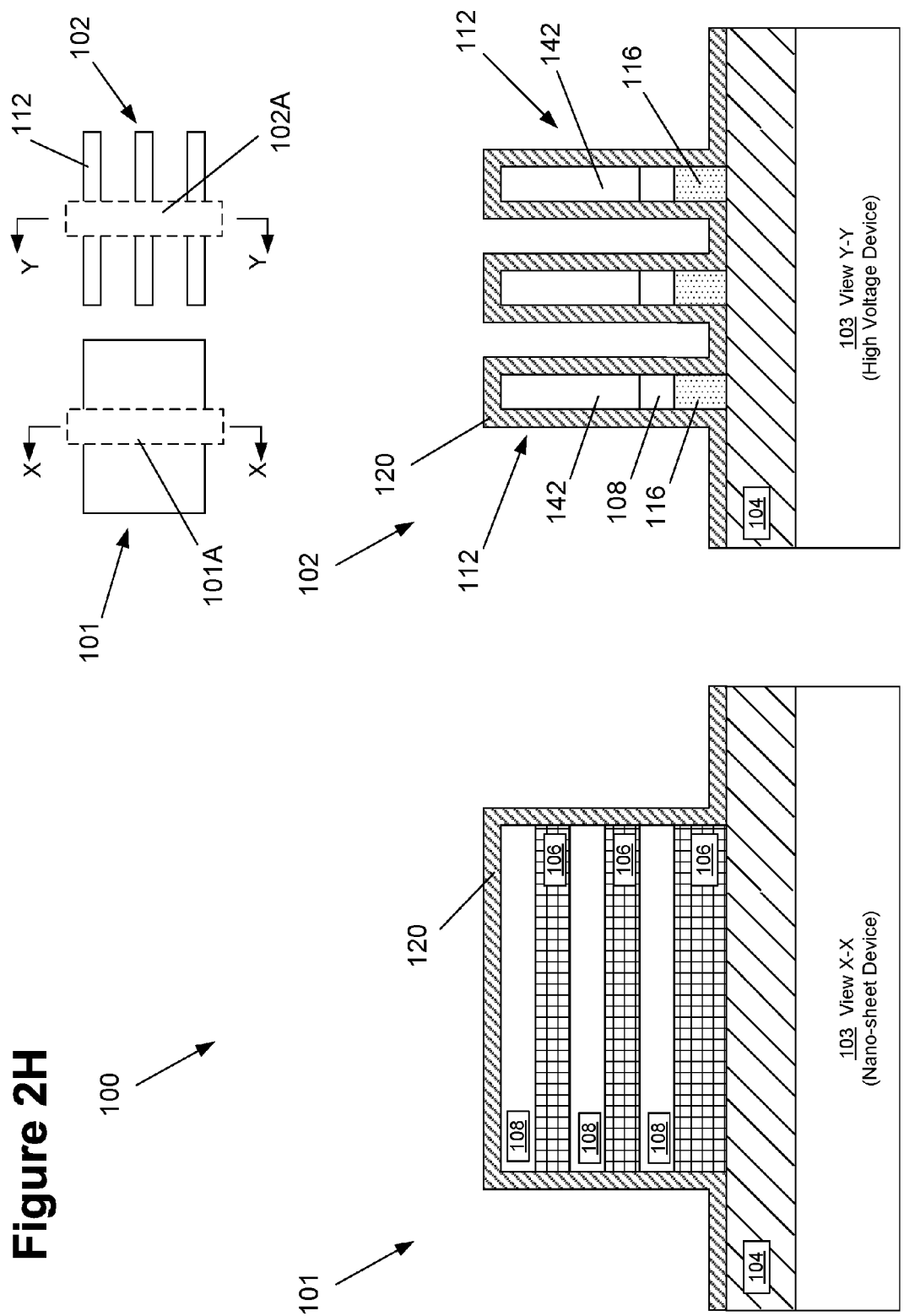

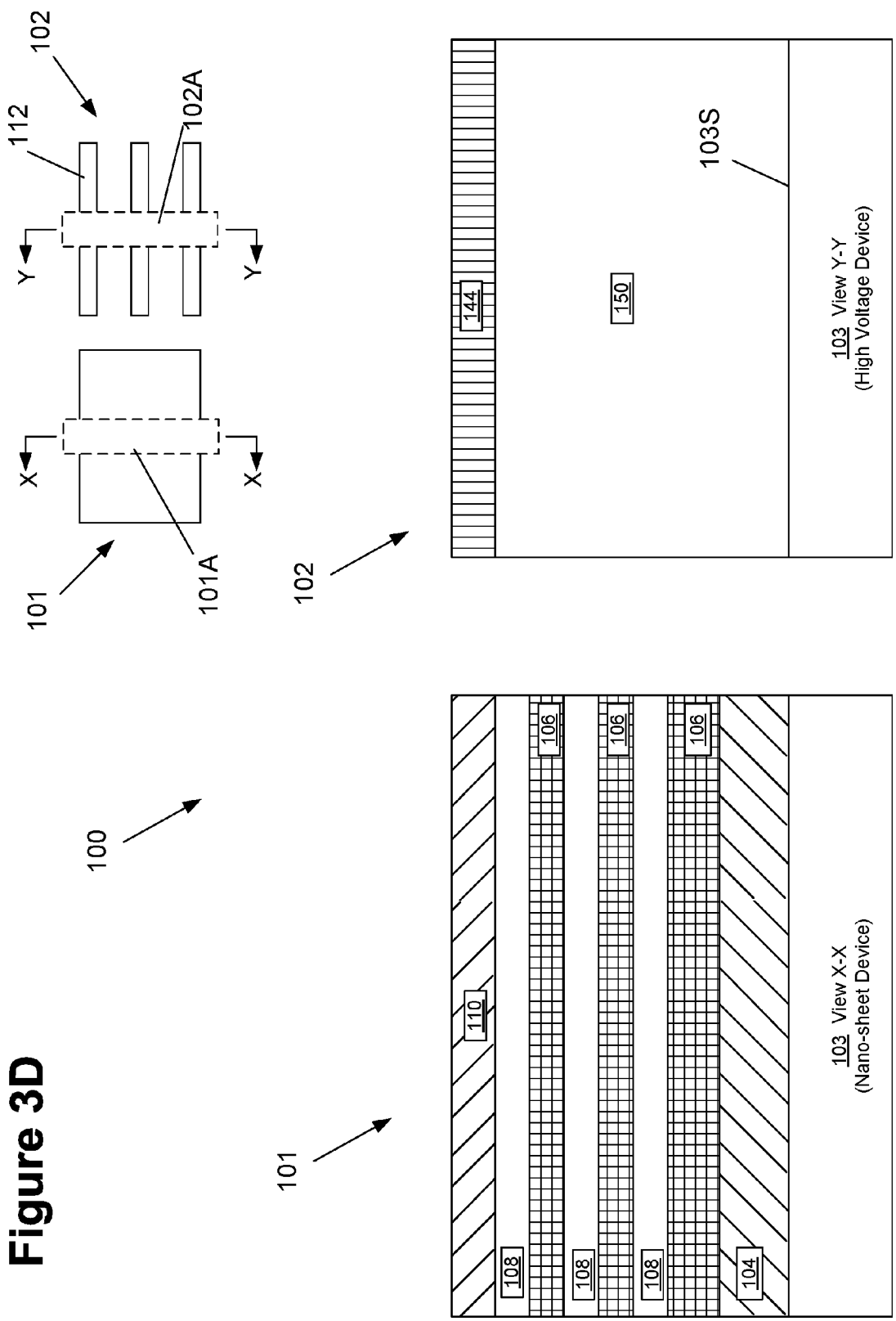

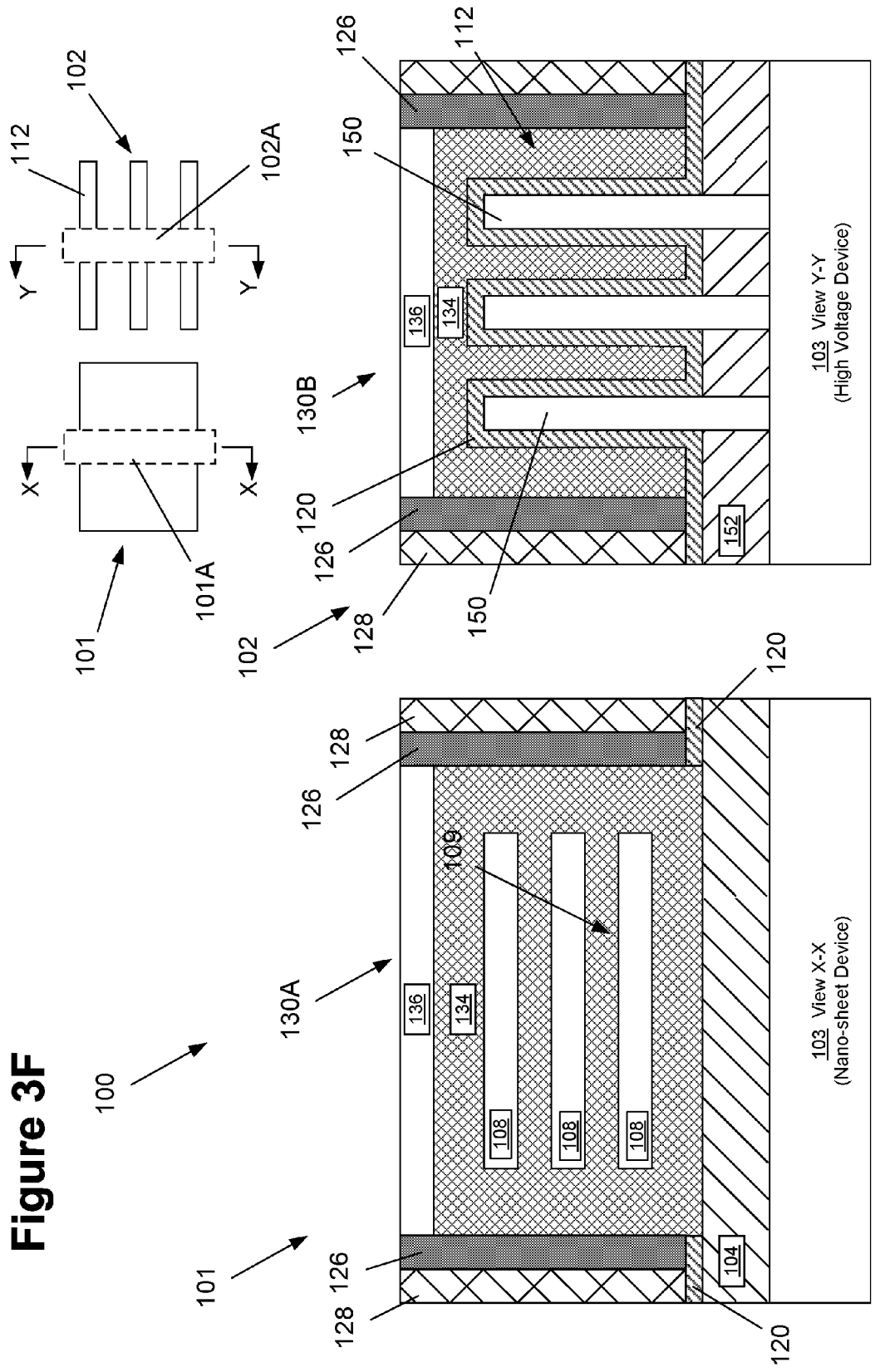

US 10,014,389 B2

1

METHODS OF FORMING IC PRODUCTS COMPRISING A NANO-SHEET DEVICE AND A TRANSISTOR DEVICE HAVING FIRST AND SECOND REPLACEMENT GATE STRUCTURES

BACKGROUND OF THE INVENTION

1. Field of the Invention

Generally, the present disclosure relates to the manufacture of semiconductor devices, and, more specifically, to various novel methods of forming an integrated circuit (IC) product comprising a nano-sheet device and a transistor device.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

A conventional FET is a planar device wherein the entire channel region of the device is formed parallel and slightly below the planar upper surface of the semiconducting substrate. In contrast to a planar FET, there are so-called 3D devices, such as an illustrative FinFET device, which is a three-dimensional structure.

One type of device that shows promise for advanced IC products of the future is generally known as a nano-sheet device. In general, a nano-sheet device has a channel structure that is comprised of a plurality of vertically spaced-apart sheets of semiconductor material, wherein the gate structure for the device is positioned around each of these spaced-apart layers of channel semiconductor material. Such a nano-sheet device may be formed as part of a high speed logic circuit. Typically, the nano-sheet device may be operated at a relatively low voltage, e.g., 1 V or less (based on today's technology) and it is specifically designed for high-speed operation and low-power consumption (especially for IC products that are employed in mobile devices like smart-phones). Typically, the design of the nano-sheet device involves the formation of a relatively thin gate insulation layer so as to permit the nano-sheet device to operate at higher switching speeds.

However, in manufacturing modern IC products, different types of transistor devices are fabricated on the same substrate. Given the different structures and design requirements of the different types of devices, developing a process flow that allows for the efficient manufacture of such IC products with these different characteristics can be very challenging. For example, in some applications, such a nano-sheet device may be fabricated on the same substrate that comprises a high voltage transistor device that is part of an input/output (I/O) circuit that is adapted to interface with

2 outside power supplies. Such a high voltage device may be exposed to significantly higher operating voltages, e.g., 1.3 V or more (based upon today's technology), as compared to the operating voltages of other circuits within the product. In contrast to the design and structure of a nano-sheet device, the high voltage device may be required to have a much thicker gate insulation layer than that of the nano-sheet device so as to prevent dielectric breakdown when the high voltage device is exposed to much higher operating voltages. What is needed is an efficient and effective process flow for forming such different devices on the same substrate.

The present disclosure is directed to various novel methods of forming an integrated circuit (IC) product comprising a nano-sheet device and a transistor device and resulting structures that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming an integrated circuit (IC) product comprising a nano-sheet device and a transistor device. One illustrative method disclosed herein includes, among other things, forming channel semiconductor material for the nano-sheet device and the transistor device, forming a device gate insulation layer for the transistor device on both the nano-sheet device and on the transistor device, forming a first sacrificial gate structure for the nano-sheet device above the device gate insulation layer, and forming a second sacrificial gate structure for the transistor device above the device gate insulation layer. In this example the method also includes removing the first and second sacrificial gate structures so as to define, respectively, a first gate cavity for the nano-sheet device and a second gate cavity for the transistor device, wherein the device gate insulation layer is exposed within each of the first and second gate cavities, removing the device gate insulation layer for the transistor device from within the first gate cavity while leaving the device gate insulation layer in position within the second gate cavity, and forming first and second replacement gate structures in the first and second gate cavities, respectively.

BRIEF DESCRIPTION OF THE DRAWINGS

The disclosure may be understood by reference to the following description taken in conjunction with the accompanying drawings, in which like reference numerals identify like elements, and in which:

FIGS. 1A-1M depict various illustrative novel methods disclosed herein for forming an integrated circuit (IC) product comprising a nano-sheet device and a transistor device;

FIGS. 2A-2I depict other illustrative novel methods disclosed herein for forming an integrated circuit (IC) product comprising a nano-sheet device and a transistor device; and FIGS. 3A-3F depict yet other illustrative novel methods disclosed herein for forming an integrated circuit (IC) product comprising a nano-sheet device and a transistor device.

Figure 1B:
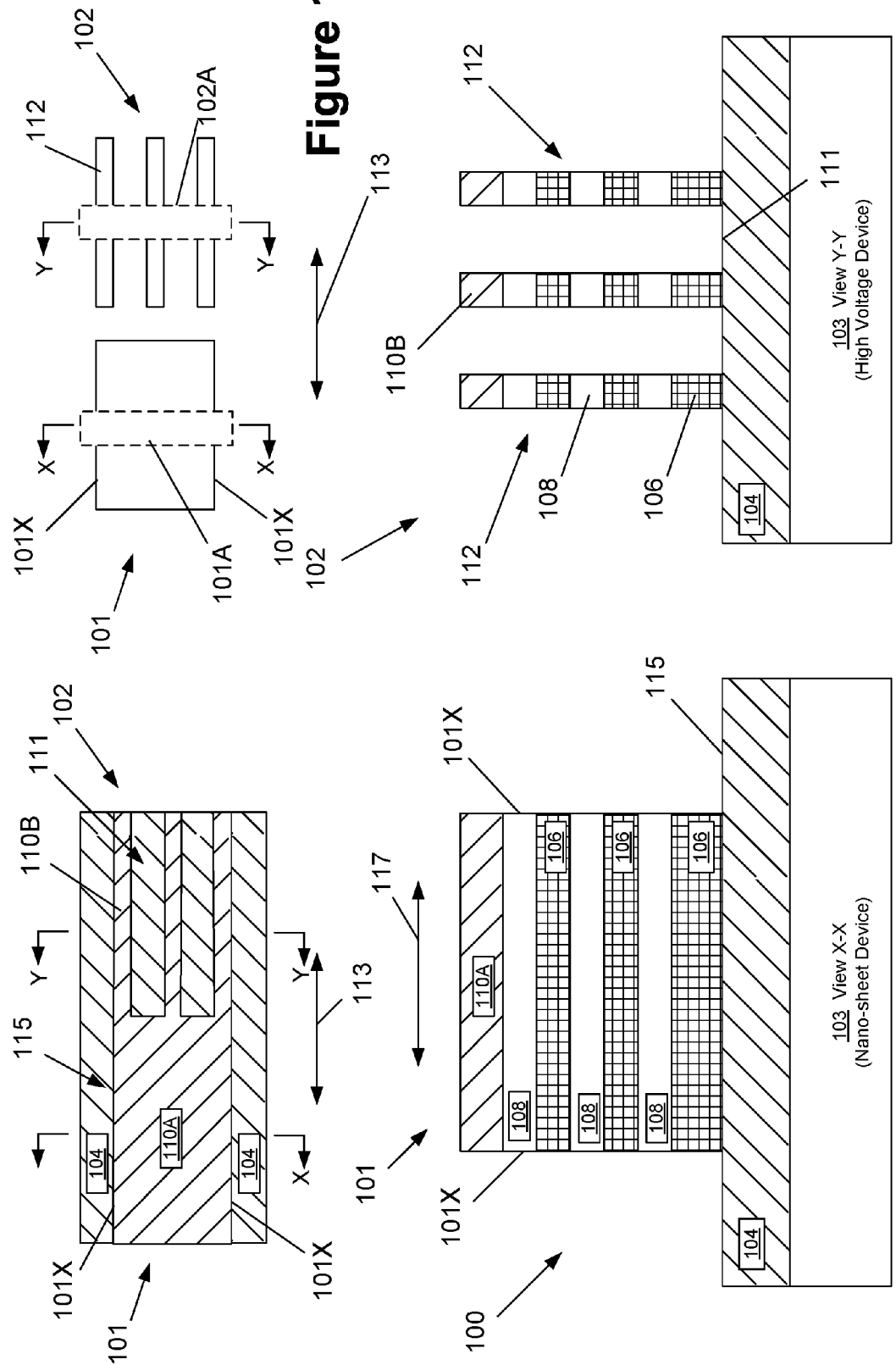

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 1A-1M depict various illustrative novel methods disclosed herein for forming an integrated circuit (IC) product 100 comprising a nano-sheet device 101 and a transistor device 102. In the examples depicted herein, the integrated circuit product 100 will be formed in and above a semiconductor substrate 103. The substrate 103 may have a variety of configurations, such as the depicted semiconductor-on-insulator (SOI) configuration that includes a bulk semiconductor layer, a buried insulation layer 104 positioned on the bulk substrate and an active semiconductor layer positioned on the buried insulation layer 104. Alternatively, the substrate 103 may have a simple bulk configuration. The substrate 103 may be made of silicon or it may be made of materials other than silicon, e.g., silicon-germanium, a III-V compound semiconductor material, etc. Thus, the terms "substrate" or "semiconductor substrate" should be understood to cover all semiconducting materials and all forms of such materials.

In the example depicted herein, the IC product 100 is comprised of an illustrative nano-sheet transistor device 101 and a transistor device 102. In one example, the nano-sheet device 101 may be formed as part of a high speed logic circuit. In one illustrative embodiment, the device 102 may be a high voltage device that is part of an input/output (I/O) circuit that is adapted to interface with outside power supplies which may be significantly higher than the operating voltage of other circuits within the product 100. Typically, the nano-sheet device 101 may be operated at a relatively low voltage, e.g., 1.0 V or less (based upon today's technology), and it is specifically designed for high-speed operation and low-power consumption (especially for IC products 100 that are employed in mobile devices like smartphones). Typically, the design of the nano-sheet device 101 involves the formation of a relatively thin gate insulation layer so as to permit the nano-sheet device 101 to operate at higher speeds. In contrast, the high voltage device 102 may be formed with a much thicker gate insulation layer than that of the nano-sheet device 101 so as to prevent dielectric breakdown when the high voltage device 102 is exposed to much higher operating voltages, e.g., 1.3 V or more (based upon today's technology). Since both of the devices must be formed on the same substrate 103, the present application is directed to various novel methods that permit the formation of the devices 101, 102 above the same substrate 103 in an efficient manner. The drawings contain a simplistic plan view of the product 100 and the devices 101, 102 and indicate where various cross-sectional views are taken. The illustrative device 102 depicted herein will be formed with a plurality of fin-like structures 112 and a gate structure 102A (depicted in dashed lines in the plan view) will be formed across the fin-like 112 structures of the device 102. A gate structure 101A (depicted in dashed lines in the plan view) will also be formed for the nano-sheet device 101. However, no attempt will be made to show the various steps depicted in the cross-sectional views in the drawings in the plan view of the product 100.

FIG. 1A depicts the product 100 at a point in fabrication wherein several process operations have been performed. First, alternating layers of semiconductor materials 106, 108 were formed above the substrate 103. Thereafter, a masking layer 110, e.g., silicon nitride, was formed above the uppermost semiconductor material layer 108. In general, the semiconductor materials 106, 108 are made of different semiconductor materials, and they are made of materials that may be selectively removed (by etching) relative to one another. In the examples depicted herein, the semiconductor material 106 is sacrificial in nature while the semiconductor material 108 will become the channel region material for the devices 101 and 102. In one illustrative embodiment, the semiconductor material 106 may comprise silicon-germanium ($Si_xGe_{(1-x)}$ where x ranges from 0.0 to 0.9) and the semiconductor material 108 comprises substantially pure silicon. The thickness of the layers of semiconductor materials 106, 108 may vary depending upon the particular application and they need not have the same thickness, although they may in some applications. Moreover, each of the layers of semiconductor materials 108 (for example) need not be formed to the same thickness, although such a situation may occur in some applications. In one illustrative embodiment, the layers of semiconductor material 106 may have a thickness of about 8-15 nm, while the layers of semiconductor material 108 (the channel materials) may have a thickness of about 6-10 nm. The number of layers of semiconductor materials 106, 108 that are formed may also vary depending upon the particular application. In the illustrative example depicted herein, three layers of the semiconductor material 106 and three layers of the semiconductor material 108 are formed above the substrate 103.

The layers of semiconductor materials 106, 108 may be formed using a variety of techniques. In one illustrative example, where the substrate 103 is an SOI substrate, the substrate may be obtained from the substrate supplier with an active layer being made of the semiconductor material 106. Alternatively, the active layer of the SOI substrate may be silicon as originally supplied by the substrate supplier. The active silicon layer may be converted to a layer of silicon germanium by epitaxially depositing a germanium-containing material (e.g., SiGe) or germanium on the silicon active layer, and thereafter performing an anneal process to cause the germanium in the germanium or silicon germanium layer to diffuse into the silicon active layer. In yet another example, the substrate 103 may be a simple bulk silicon substrate. In that case, the first layer of the semiconductor material 106, e.g., silicon germanium may be epitaxially deposited on the upper surface of the bulk silicon substrate. Irrespective of how the first layer of the semiconductor material 106 is formed, the subsequent layers of the semiconductor materials 106, 108 may be sequentially deposited on the substrate by performing multiple epitaxial deposition processes. After the formation of the uppermost layer of semiconductor material 108, the masking layer 110 was formed on the substrate. In some cases, the masking layer 110 may be comprised of multiple layers of material, e.g., a combination of a silicon dioxide layer (e.g., a pad oxide—not separately shown) and a silicon nitride layer (e.g., a pad nitride—not separately shown). However, in some cases, the pad oxide layer may be omitted if desired.

FIG. 1B depicts the product 100 after several process operations were performed. First, the masking layer 110 was patterned to define a patterned etch mask portion 110A for the nano-sheet device 101 and a pattered fin-formation etch mask portion 110B for the device 102. The masking layer 110 may be patterned by using traditional lithography and etching processes. Then, one or more etching processes were performed through the patterned masking layer 110 to remove exposed portions of the layers of semiconductor materials 106, 108. These patterning processes result in the formation of a plurality of trenches 111 that result in the formation of a plurality of fin-like structures 112 for the device 102. Of course, any number of fins 112 may be formed for the device 102. These patterning processes also result in the formation of a plurality of trenches 115 that define a stack of semiconductor materials 106, 108 for the nano-sheet device 101. This patterning process establishes the gate width (in the direction indicated by the double arrow 117) of what will become the channel region portions of the nano-sheet device 101 as defined by the cut edges 101X (see view X-X and the plan view on the right) of the nano-sheet device. FIG. 1B contains another simplistic plan view of the patterned masking layer 110 after the patterning processes were performed and depicts the insulation material 104 exposed at the bottom of the trenches 111 and 115. As depicted, in this patterning process, the semiconductor materials 106, 108 are only cut in one direction. At this point in time, after the patterning process depicted in FIG. 1B is completed, portions of the layers of semiconductor materials 106, 108 remain uncut and extend across the substrate 103 in the direction indicated by the double arrow 113 shown in the plan view, the layers of semiconductor materials 106, 108 extend into and out of the plane of the drawing page.

With continuing reference to FIG. 1B, the overall size, shape and configuration of the trenches 111, 115 and the fins 112 may vary depending on the particular application. In the illustrative examples depicted in the attached figures, the trenches 111, 115 and the fins 112 will be simplistically depicted as having generally rectangular portions and sections. In an actual real-world device, the sidewalls of the fins 112 may be somewhat outwardly tapered (i.e., the fins may be wider at the bottom of the fin than they are at the top of the fin), although that configuration is not depicted in the attached drawings. Thus, the size and configuration of the trenches 111, 115 and the fins 112, and the manner in which they are made, should not be considered a limitation of the present invention. For ease of disclosure, only the substantially rectangular-shaped trenches 111, 115 and fins 112 having a substantially rectangular-shaped cross-sectional configuration will be depicted in the drawings.

FIG. 1C depicts the product 100 after several process operations were performed. First, a patterned masking layer 114 with an opening 114A (see plan view) was formed on the product 100. The patterned masking layer 114 covers the nano-sheet device 101 and exposes a portion of the fins 112 of the device 102 where the channel region of the device 102 will be formed. In the depicted example, the opening 114A is depicted as being very small and perfectly aligned to the gate structure, which can be difficult to achieve. In practice, the width of the size of the opening 114A may be much larger so as to make it easier to at least partially align with the gate and it does not matter if some of the SiGe materials in the source/drain region of the device 102 are removed. The patterned masking layer 114 may be a patterned layer of photoresist or OPL. Then, an etching process was performed through the opening 114A in the patterned masking layer 114 to selectively remove the portions of the layers of the semiconductor material 106 relative to the layers of semiconductor material 108. In one embodiment, the etching process may be a wet etching process or an isotropic dry etching process. It should be noted that, at this point in time, portions of the layers of semiconductor material 106 that extend into and out of the plane of the drawing page and are positioned under the patterned masking layer 114 remain in place so as to provide mechanical support to the layers of the semiconductor material 108 after the portions of the layers of the semiconductor material 106 have been removed. This process operation results in the formation of a plurality of vertically spaced-apart layers of the semiconductor material 108 for the device 102 with open spaces 107 therebetween in what will become the channel region for the device 102.

FIG. 1D depicts one illustrative process flow wherein a conformal deposition process, such as an ALD process, was performed to form a layer of insulating material 116 (e.g., silicon dioxide) on the product 100. The layer of insulating material 116 may be formed to any desired thickness. The layer of insulating material 116 substantially fills the spaces 107 between the vertically spaced-apart layers of the semiconductor material 108 for the device 102.

Figure 1E:
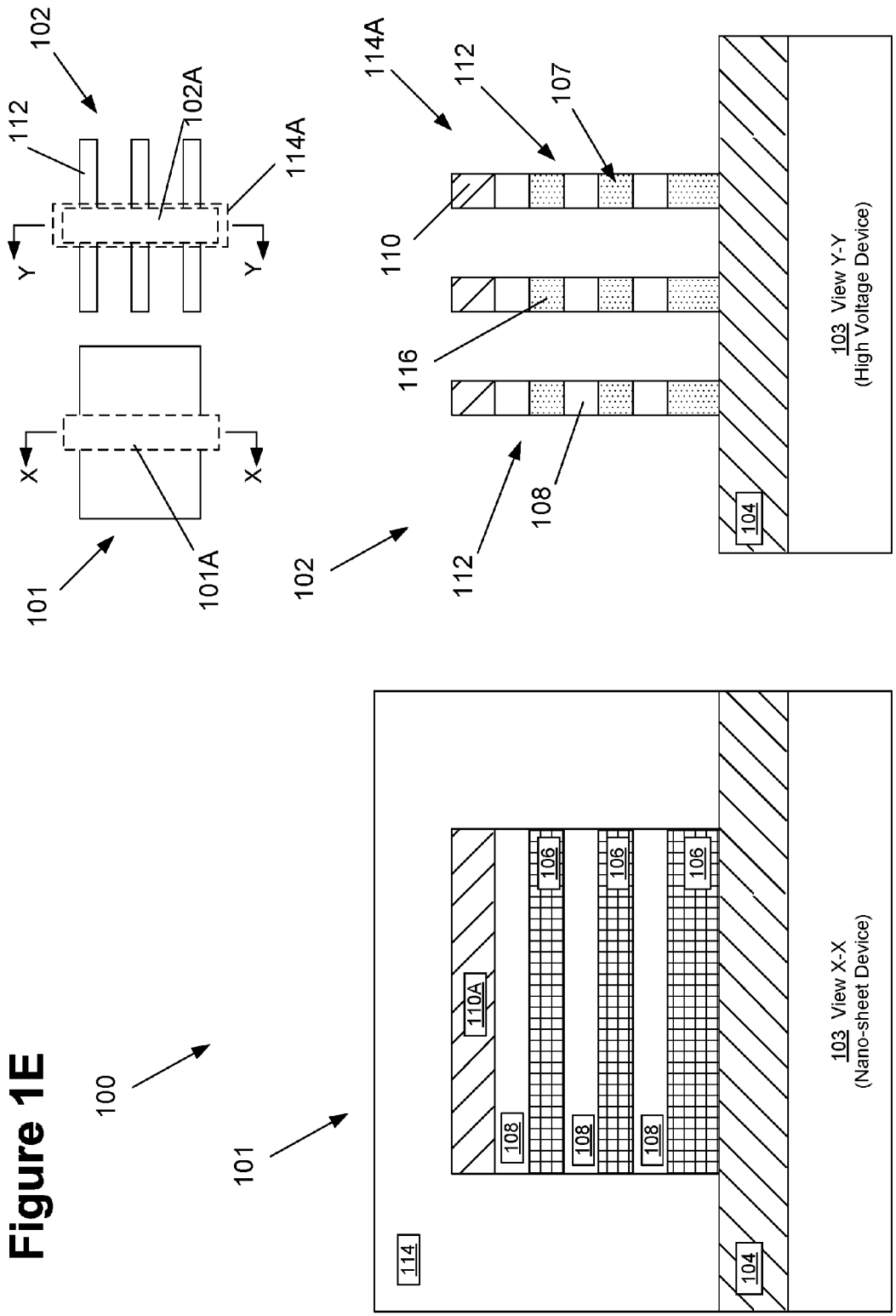

FIG. 1E depicts the product 100 after an anisotropic etching process was performed on the layer of insulating material 116. At the completion of this etching process, portions of the layer of insulating material 116 remain positioned in the spaces 107 between the vertically spaced-apart layers of the semiconductor material 108 for the device 102.

Figure 1F:
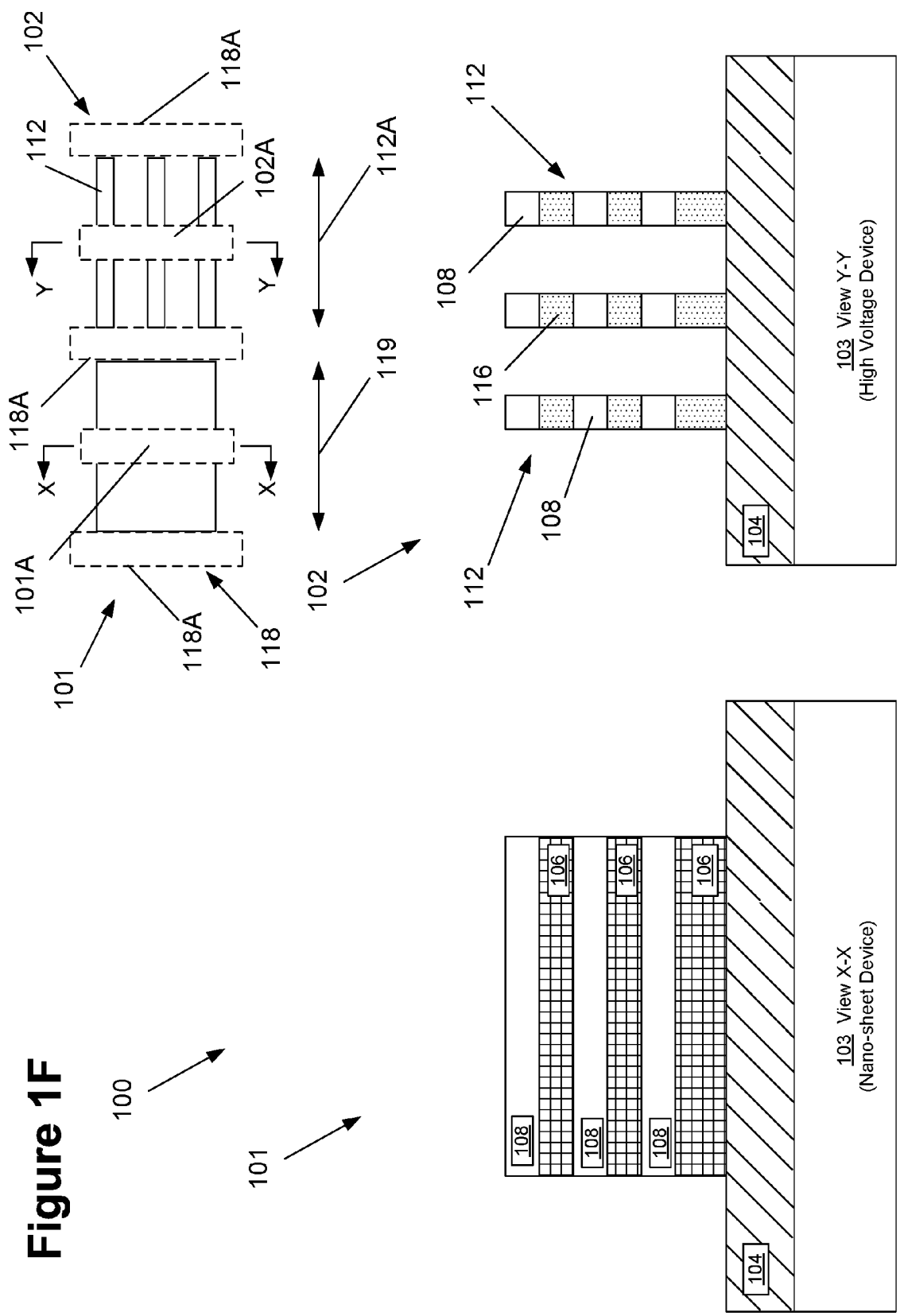

FIG. 1F depicts the product 100 after several process operations were performed. First, the patterned masking layer 114 was removed thereby, exposing both the nano-sheet device 101 and the device 102. Then, another patterned masking layer 118 with a plurality of openings 118A (see plan view) was formed on the product 100. The patterned masking layer 118 may be a patterned layer of photoresist or OPL. Then, an etching process was performed through the openings 118A in the patterned masking layer 118 to remove the portions of the layers of the semiconductor materials 106, 108 positioned under the openings 118A. In this etching process, the semiconductor materials 106, 108 are cut and removed in a direction that is orthogonal to the direction of the cut shown in FIG. 1B. At the completion of these etching processes, the axial length 112A (see plan view) of the fins 112 of the device 102 is set, as well as the overall length 119 of the materials for the nano-sheet device 101 in the gate length direction of the device 101. At this point, the semiconductor materials 106, 108 for the nano-sheet device 101 may have an approximately square or rectangular shaped configuration when viewed from above. Note that, at this point, a certain portion, i.e., a central portion, of the semiconductor materials 106 (with the overall length 119) for the nano-sheet device 101 will become part of the channel structure for the nano-sheet device 101, while other portions (on opposite sides of the central portion) of the semiconductor materials 106, will serve as the source/drain regions for the nano-sheet device 101.

Figure 1G:
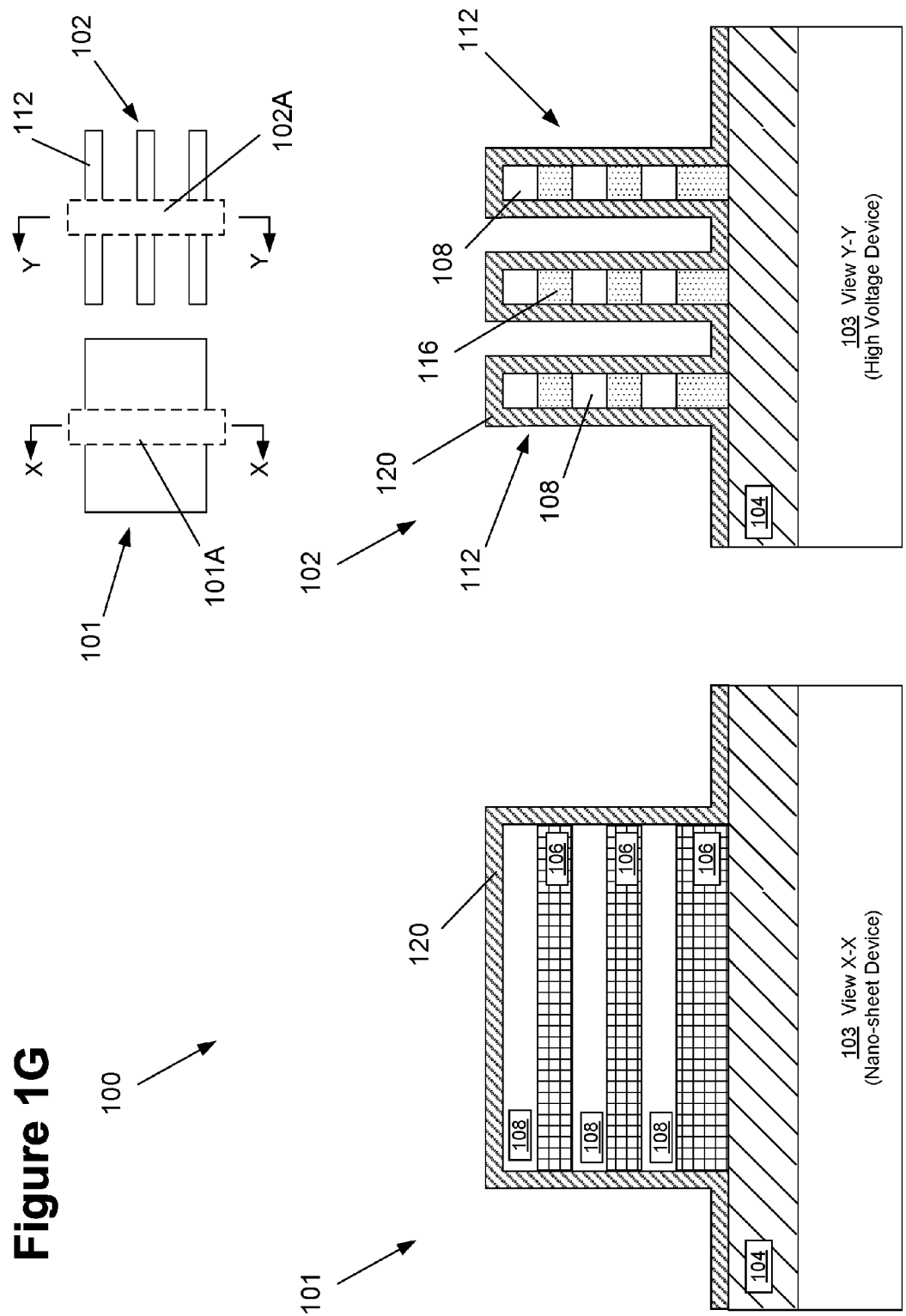

FIG. 1G depicts the product 100 after several process operations were performed. First, the patterned masking layer 118 was removed, thereby exposing both the nano-sheet device 101 and the device 102. Then, a conformal layer of insulating material 120 was formed on both the nano-sheet device 101 and the device 102. In one embodiment where the device 102 is a high voltage device, the layer of insulating material 120 may be relatively thick and it will function as part of the gate insulation layer for the device 102. In one illustrative embodiment, the layer of insulating material 120 may be comprised of silicon dioxide, silicon oxynitride, etc., and it may have a thickness of about 2.5-5 nm. In an alternative process flow, the formation of the layer of insulating material 116 may be omitted and, prior to performing the etching process depicted in FIG. 1F, the layer of insulating material 120 may be deposited in the spaces 107 between the vertically spaced-apart layers of the semiconductor material 108 for the device 102.

The next major processing operations involve forming gate structures for both the nano-sheet device 101 and the device 102. The gate structures may be manufactured using either the so-called "gate-first" or "replacement gate" techniques. In the example depicted herein, the gate structures will be formed using a replacement gate manufacturing technique. Accordingly, FIG. 1H depicts the product 100 after an illustrative and representative sacrificial gate structure 122, a gate cap layer 124 and a sidewall spacer 126 were formed for both the nano-sheet device 101 and the device 102. In one illustrative embodiment, the sacrificial gate structure 122 may include a sacrificial gate insulation layer (not separately shown) made of, for example, silicon dioxide, and a sacrificial gate electrode (not separately shown) made of, for example, polysilicon, amorphous silicon, etc. The gate cap layer 124 and the sidewall spacer 126 may be comprised of a variety of different materials, e.g., silicon nitride. The structures depicted in FIG. 1H may be formed by depositing the layers of material for the sacrificial gate structure 122 and the gate cap layers 124 across the substrate 103 and then patterning those layers of material to define the separate sacrificial gate structures 122, with the cap layer 124 positioned thereabove. Then, the spacer 126 may be formed around each of the separate sacrificial gate structures 122 by depositing a layer of spacer material and performing an anisotropic etching process.

Figure 1I:
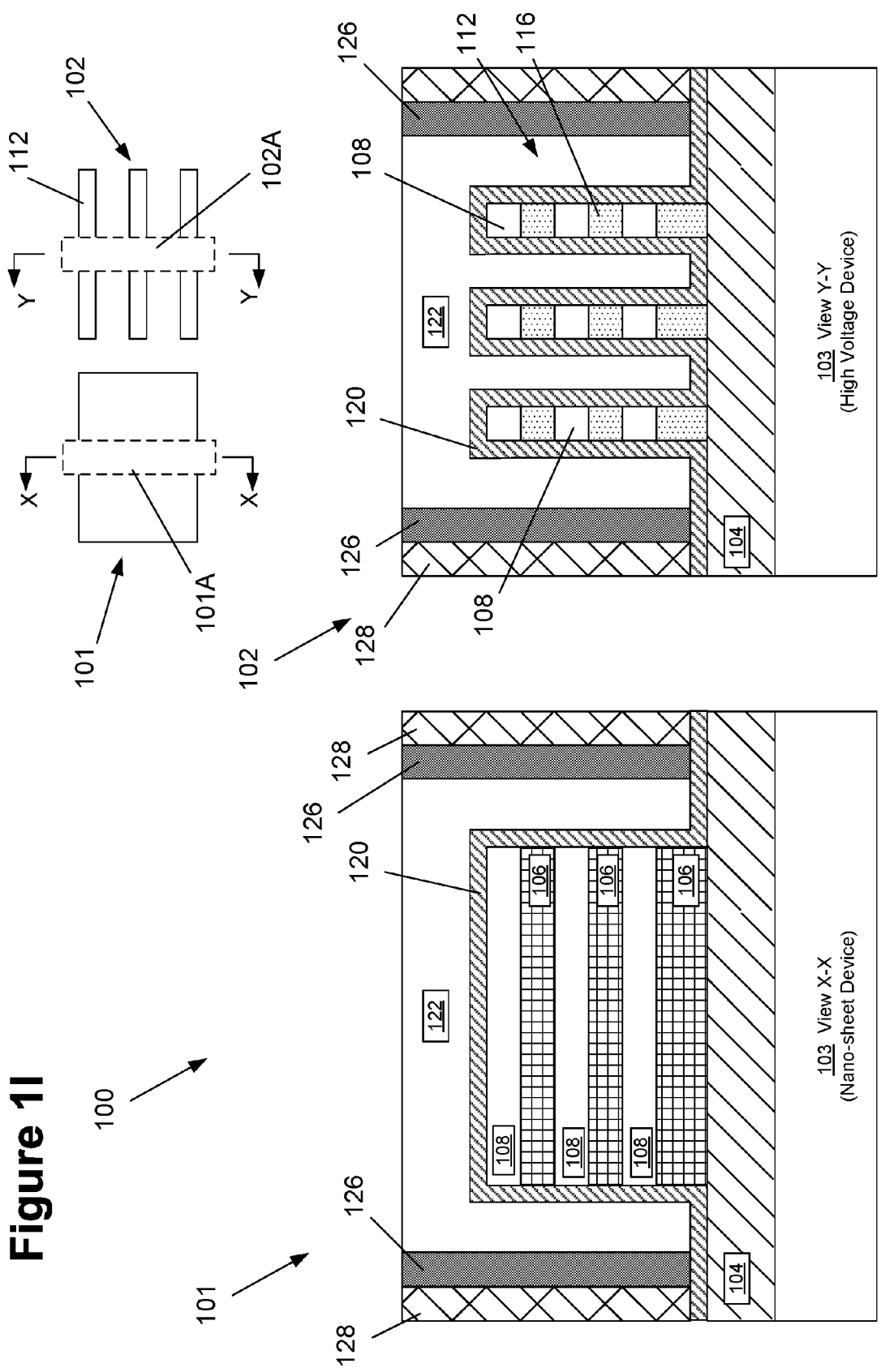

FIG. 1I depicts the product 100 after several process operations were performed. First, a layer of insulating material 128 (e.g., silicon dioxide) was deposited across the substrate 103. Then, one or more planarization processes, e.g., one or more chemical mechanical planarization processes, were performed to planarize the upper surface of the layer of insulating material 128 and to remove the gate cap layers 124 and portions of the spacers 126. These planarization processes result in the exposure of the sacrificial gate structures 122 so that they can be removed.

FIG. 1J depicts the product 100 after one or more etching processes were performed to remove the sacrificial gate structures 122 and thereby define a replacement gate cavity 130A for the nano-sheet device 101 and a replacement gate cavity 130B for the device 102 (collectively the gate cavities will be referenced using the number 130).

FIG. 1K depicts the product 100 after several process operations were performed. First, another patterned masking layer 132 was formed on the product 100. The patterned masking layer 132 covers the device 102 and exposes the nano-sheet device 101. The patterned masking layer 132 may be a patterned layer of photoresist or OPL. Then, an etching process was performed through the patterned masking layer 132 to remove portions of the layer of insulating material 120 from within the gate cavity 130A of the nano-sheet device 101, i.e., to remove the relatively thick gate insulation layer material 120 for the device 102 from the nano-sheet device 101. As depicted in view Y-Y, the relatively thick gate insulation layer material 120 remains in position on the device 102.

FIG. 1L depicts the product 100 after an etching process was performed through the patterned masking layer 132 to selectively remove the portions of the layers of the semiconductor material 106 in the gate cavity 130A relative to the layers of semiconductor material 108. In one embodiment, the etching process may be a wet etching process. This process operation results in the formation a plurality of vertically spaced-apart layers of the semiconductor material 108 within the gate cavity 130A for the nano-sheet device 101 with open spaces 109 therebetween in what will become the channel region for the nano-sheet device 101. It should be noted that, at this point in time, portions of the spaced-apart layers of semiconductor material 108 extend into and out of the plane of the drawing page through the spacer 126 and into the layer of insulating material 128. Additionally, the layers of semiconductor material 106 remain positioned between the layers of semiconductor material 108 in the areas outside of the gate cavity 130A. Thus, the spaced-apart layers of the semiconductor material 108 on the nano-device 101 within the gate cavity 130A are fully supported after the portions of the layers of the semiconductor material 106 within the gate cavity 130A of the nano-sheet device 101 have been removed.

Figure 1M:
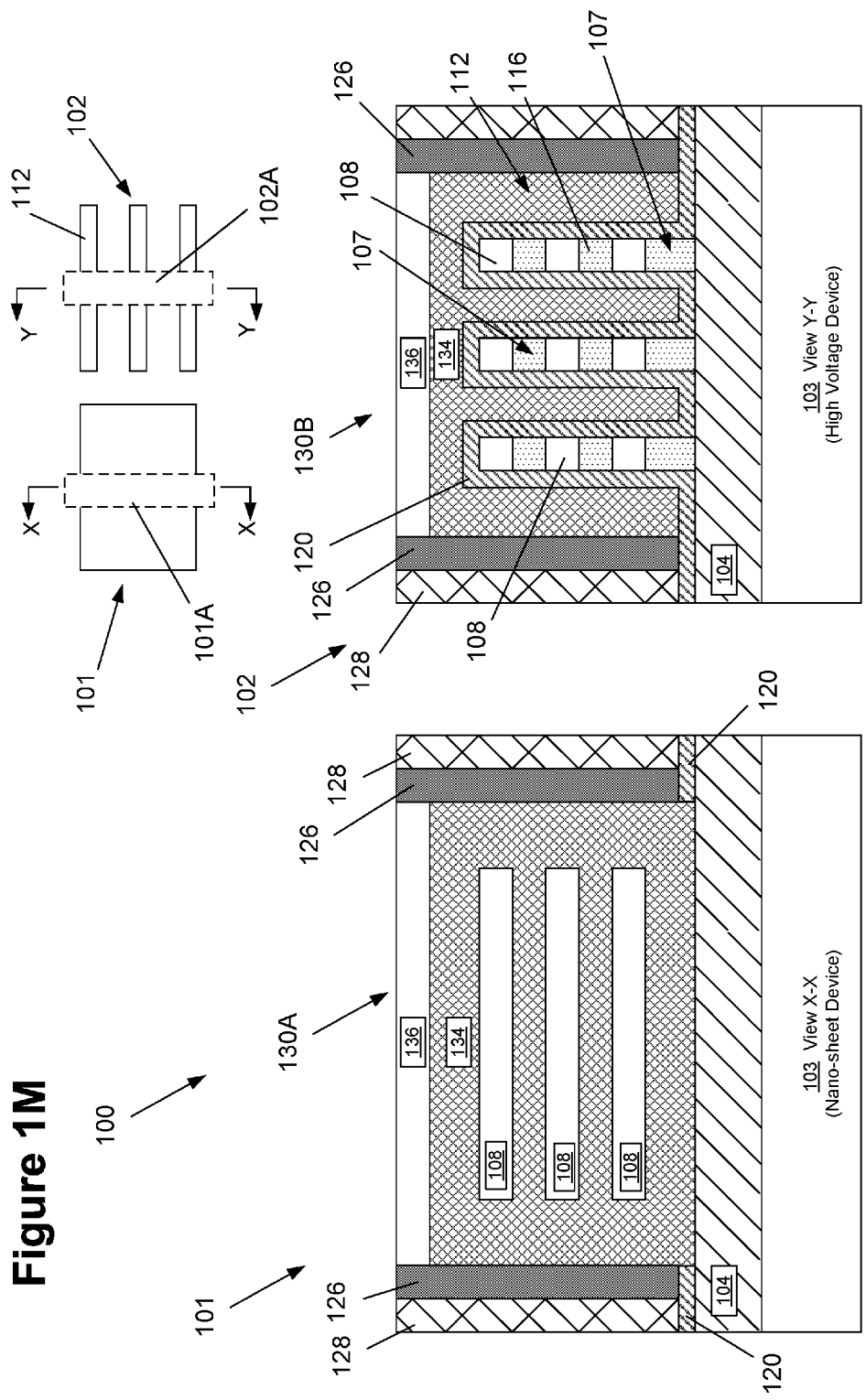

The next major operation involved forming replacement or final gate structures in the gate cavities 130 for both the nano-sheet device 101 and the device 102 by performing several common process operations. Accordingly, FIG. 1M depicts the product 100 after several process operations were performed. First, the patterned masking layer 132 was removed. Then simplistically depicted replacement gate structures 134 were formed in the gate cavities 130. In one embodiment, the replacement gate structures 134 may be formed by depositing the materials for the replacement gate structures 134 in the gate cavities 130, performing a CMP process to remove excess gate materials positioned outside of the gate cavities 130, recessing the materials for the gate structures 134 and forming a gate cap layer 136 above the recessed gate materials. The replacement (or final) gate structures 134 are intended to be representative of any kind of gate structure that may be formed on semiconductor devices. For example, the gate structures 134 may comprise a gate insulation layer (not separately shown) that is comprised of a variety of different materials, such as, for example, silicon dioxide, a so-called high-k (k greater than 10) insulation material (where k is the relative dielectric constant), etc. Similarly, the gate structures 134 may have one or more metal layers (not separately shown) that act as all or a portion of the gate electrode for the devices 101, 102. At the point of processing depicted in FIG. 1M, other processing activities may also be performed, e.g., the formation of doped halo implant regions (not shown), doped source/drain regions (not shown), the formation of epi semiconductor material (not shown) in the source/drain regions, etc.

Note that the device 102 shown in FIG. 1M is not a gate-all-around (GAA) device in that the spaces 107 between the spaced-apart channel semiconductor materials 108 are filled with the insulating material 116 (or with the insulating material 120 in the case where the insulating material 116 is not formed). Additionally, the relatively thick device gate insulation layer 120 is positioned on the device 102. Accordingly, the device 102 is very robust as it relates to its resistance of dielectric breakdown when the device 102 operates in relatively high voltage applications.

Figure 2A:
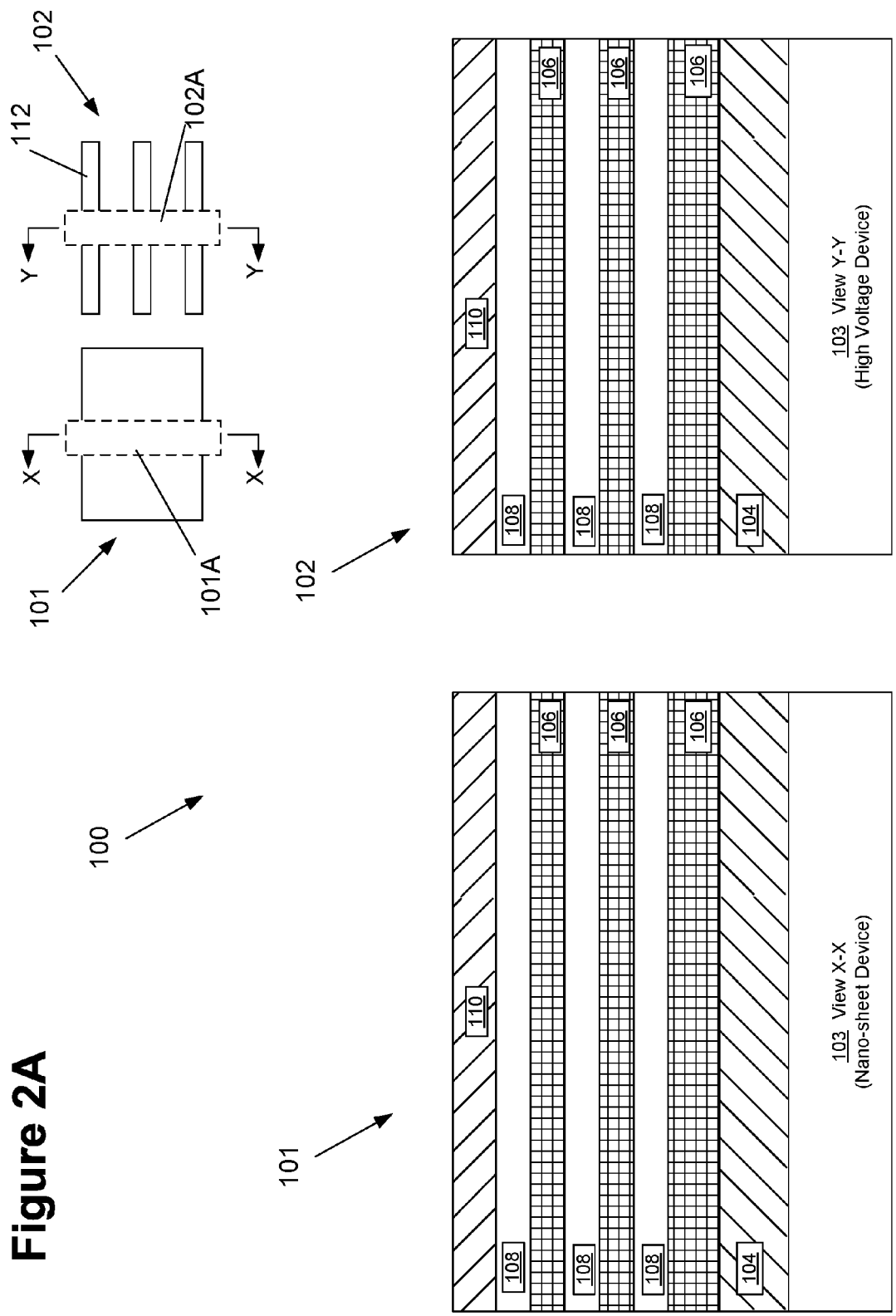

FIGS. 2A-2I depict other illustrative novel methods disclosed herein for forming an integrated circuit (IC) product comprising the nano-sheet device 101 and the device 102. FIG. 2A depicts the product 100 at a point that corresponds to that shown in FIG. 1A, i.e., after the layers of semiconductor materials 106, 108 and after the masking layer 110 were formed above the substrate 103.

Figure 2B:
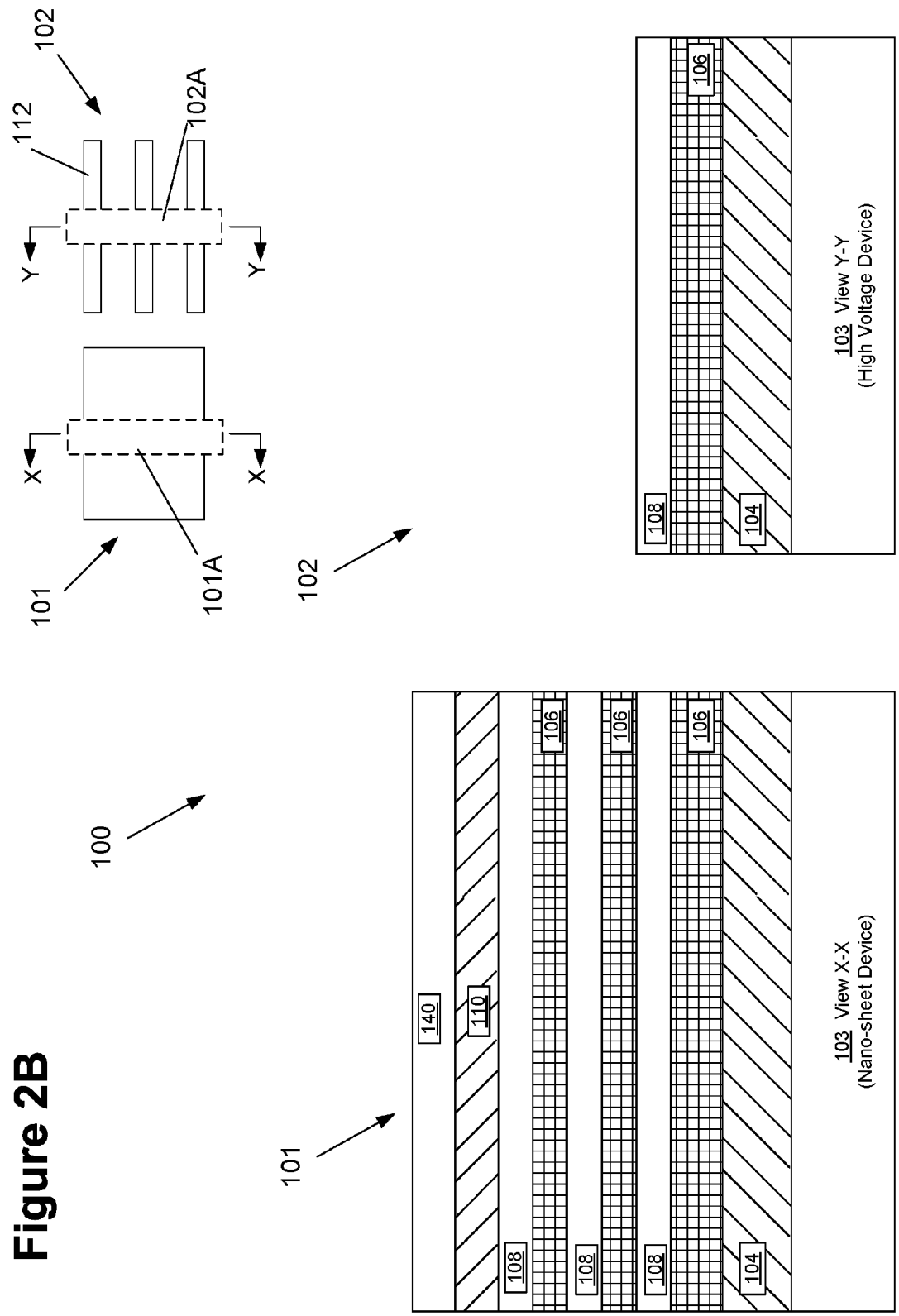

FIG. 2B depicts the product 100 after several process operations were performed. First, another patterned masking layer 140, e.g., a photomask, OPL, etc., was formed that covers the nano-sheet device 101 but exposes the device 102. Then, one or more etching processes were performed through the patterned masking layer 140 to remove exposed portions of the masking layer 110 and all but the lowermost layers of semiconductor materials 106, 108 for the device 102.

Figure 2C:
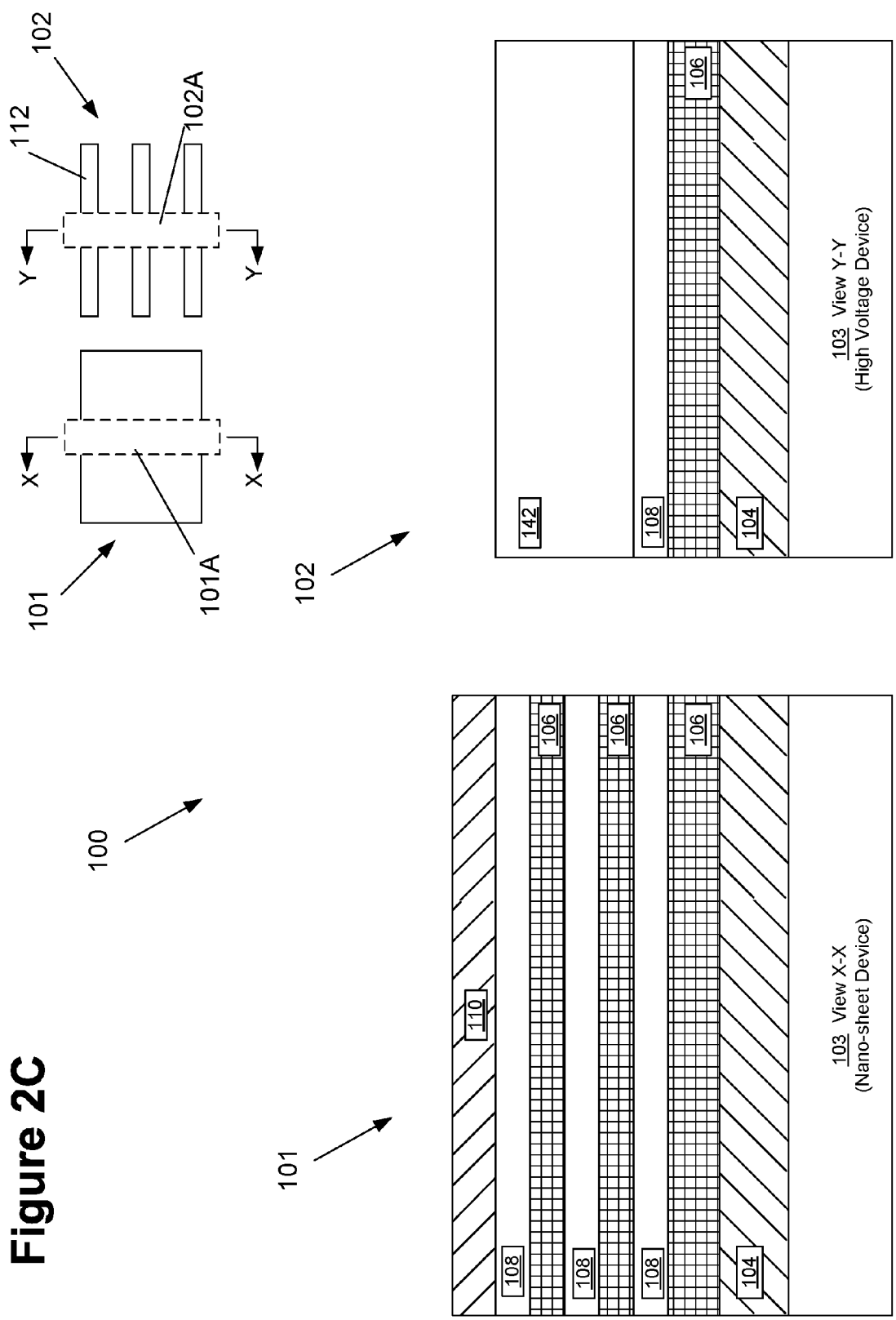

FIG. 2C depicts the product 100 after several process operations were performed. First, the patterned masking layer 140 was removed. Thereafter, an epitaxial deposition process was performed to grow channel semiconductor material 142 on the exposed surface of the layer of semiconductor material 108 for the device 102. In one illustrative embodiment, the semiconductor material 142 may be made of the same material as that of the semiconductor material 108, but that may not be the case in all applications. In general, the semiconductor material 142 should be a semiconductor material that will permit removal of the semiconductor material 106 by performing a selective etching process. The amount or thickness of the semiconductor material 142 may vary depending upon the particular application.

Figure 2D:
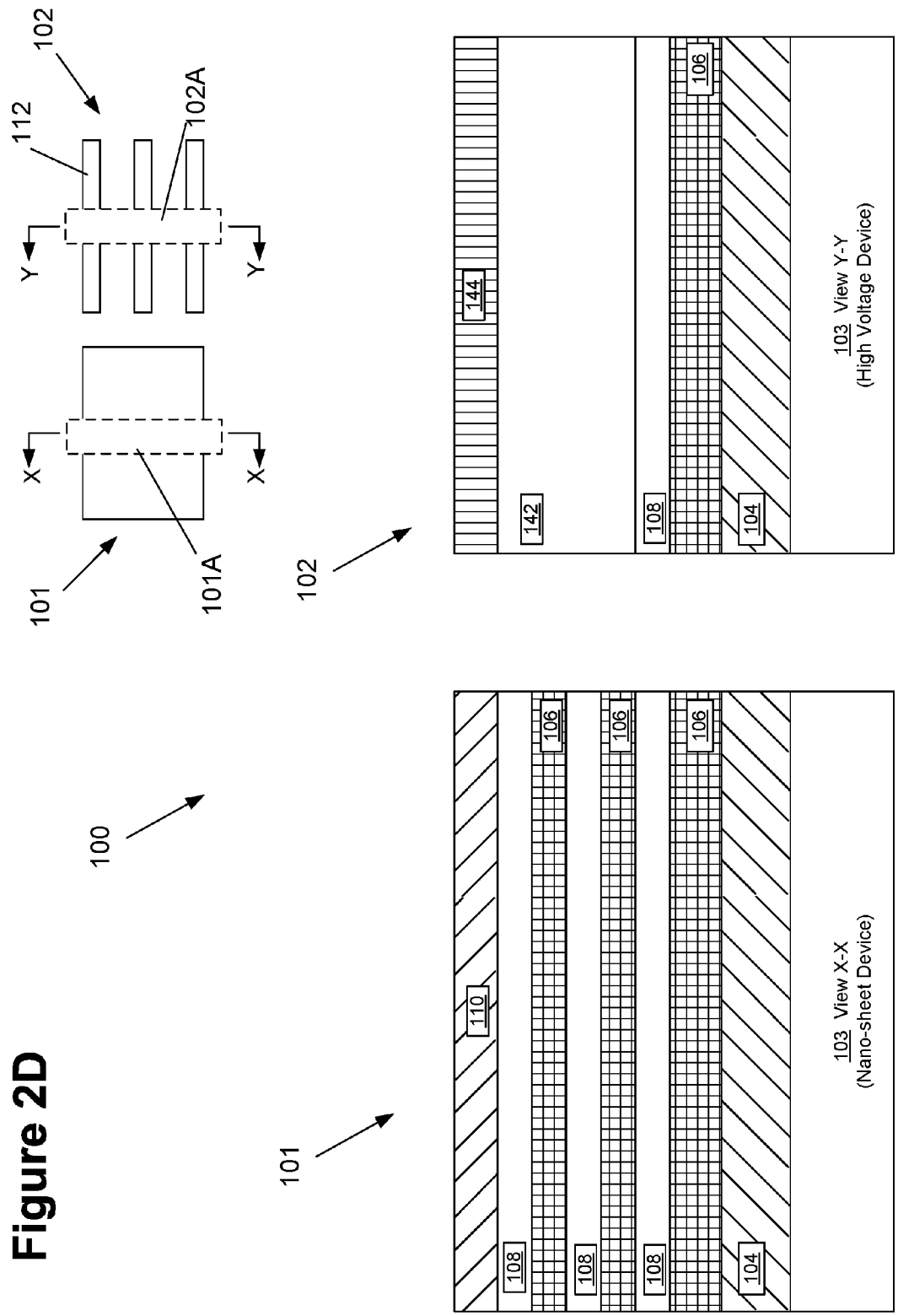

FIG. 2D depicts the product after a masking layer 144 was formed above the semiconductor material 142 for the device 102. The masking layer 144 may be comprised of the same material as that of the masking layer 110, i.e., they both may be made of silicon nitride. The masking layer 144 may be formed by depositing a layer of masking material and performing a CMP process.

Figure 2E:
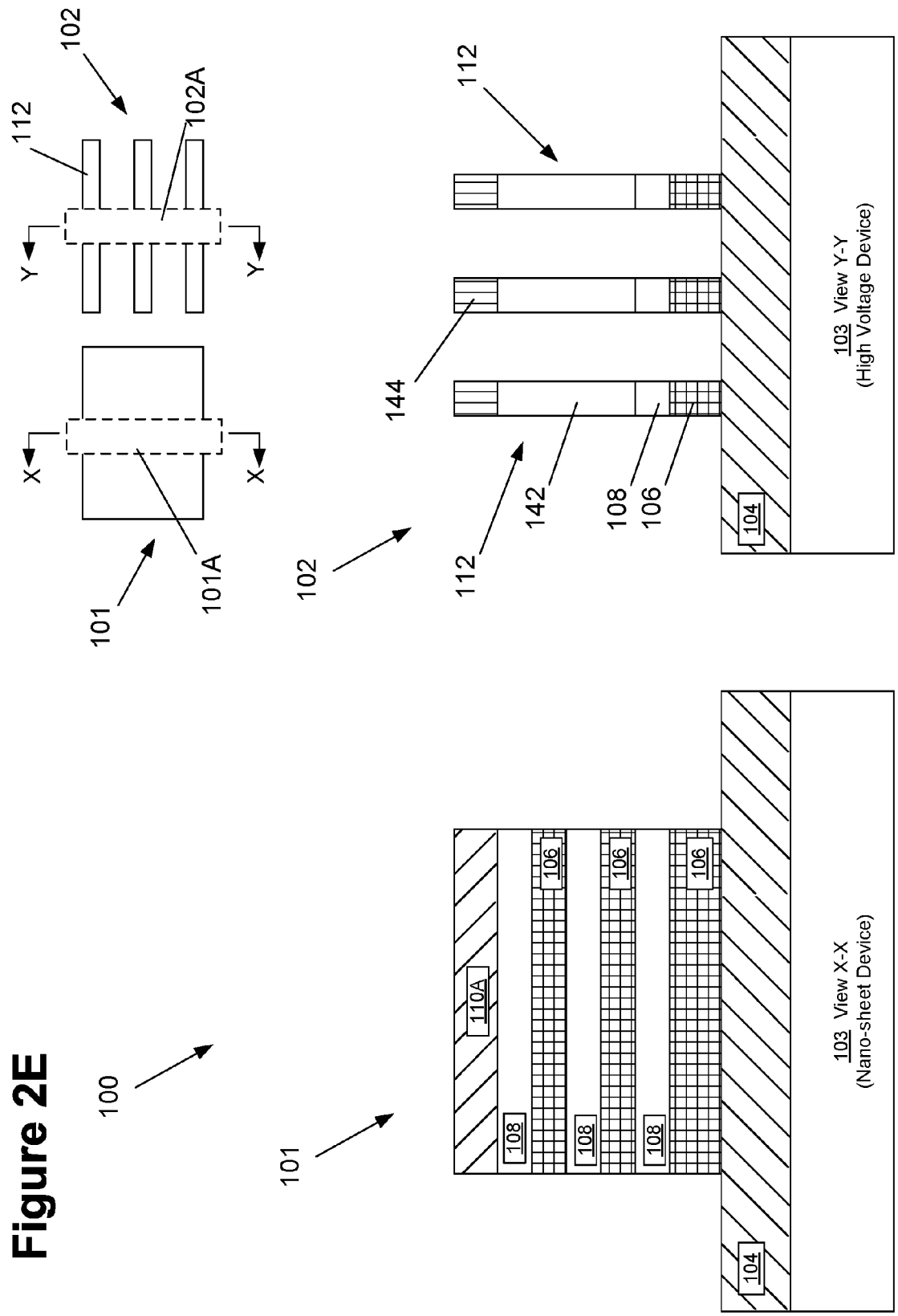

FIG. 2E depicts the product 100 after the above-described process operations performed in FIG. 1B were performed, e.g., after the basic fin structures 112 were formed. However, at this point in the process flow in this embodiment, the fins 112 comprise the semiconductor materials 106, 108 and 142.

Figure 2F:
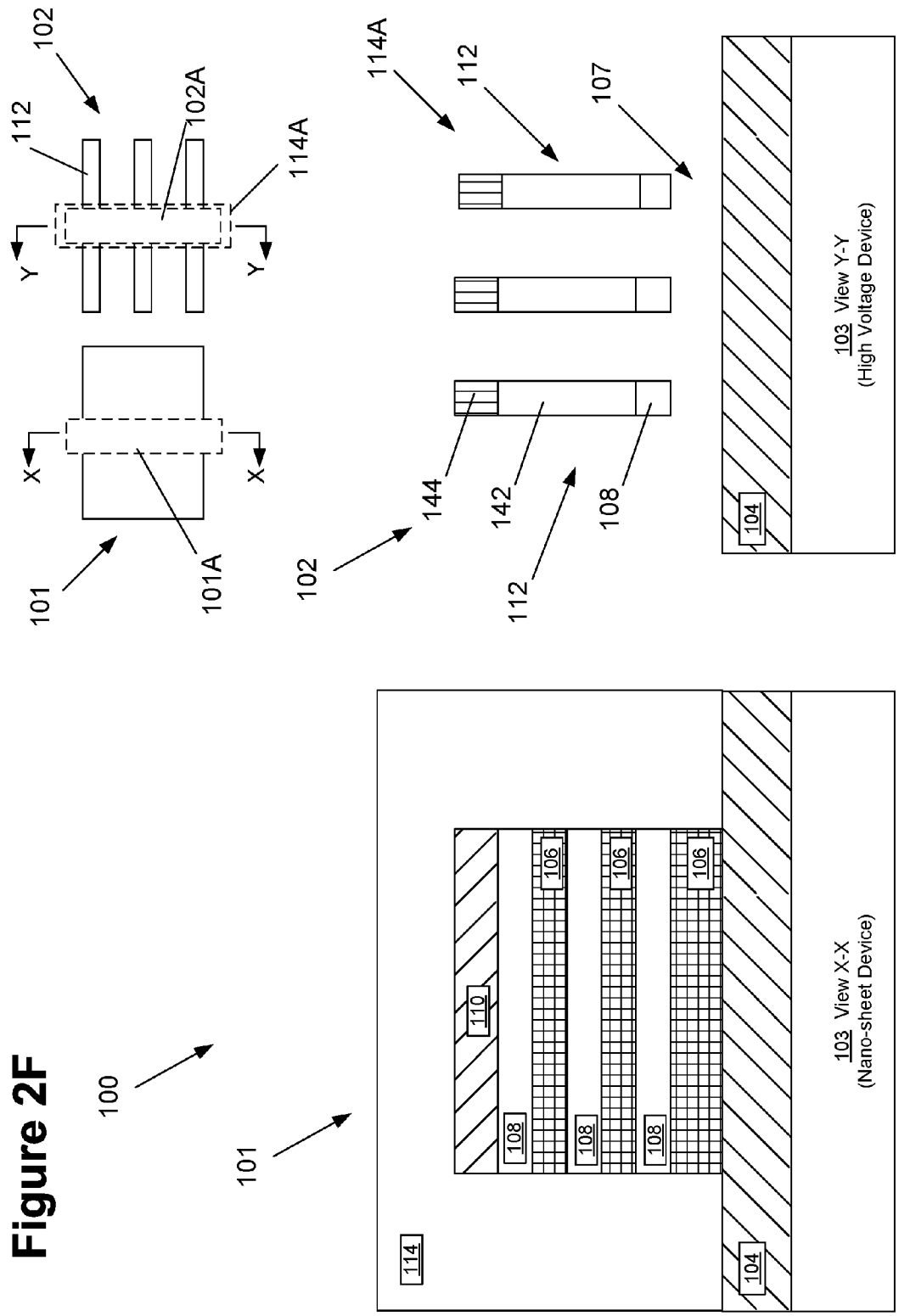

FIG. 2F depicts the product 100 after several process operations were performed. First, the above-described patterned masking layer 114 with an opening 114A (see plan view) was formed on the product 100. As before, the patterned masking layer 114 covers the nano-sheet device 101 and exposes a portion of the fins 112 of the device 102 where the channel region of the device 102 will be formed. Then, an etching process was performed through the opening 114A in the patterned masking layer 114 to selectively remove the lone remaining layer of the semiconductor material 106 relative to the layers of semiconductor materials 108 and 142. This process operation results in the formation of open spaces 107 between the layer of semiconductor material 108 and the insulation material 104.

Figure 2G:
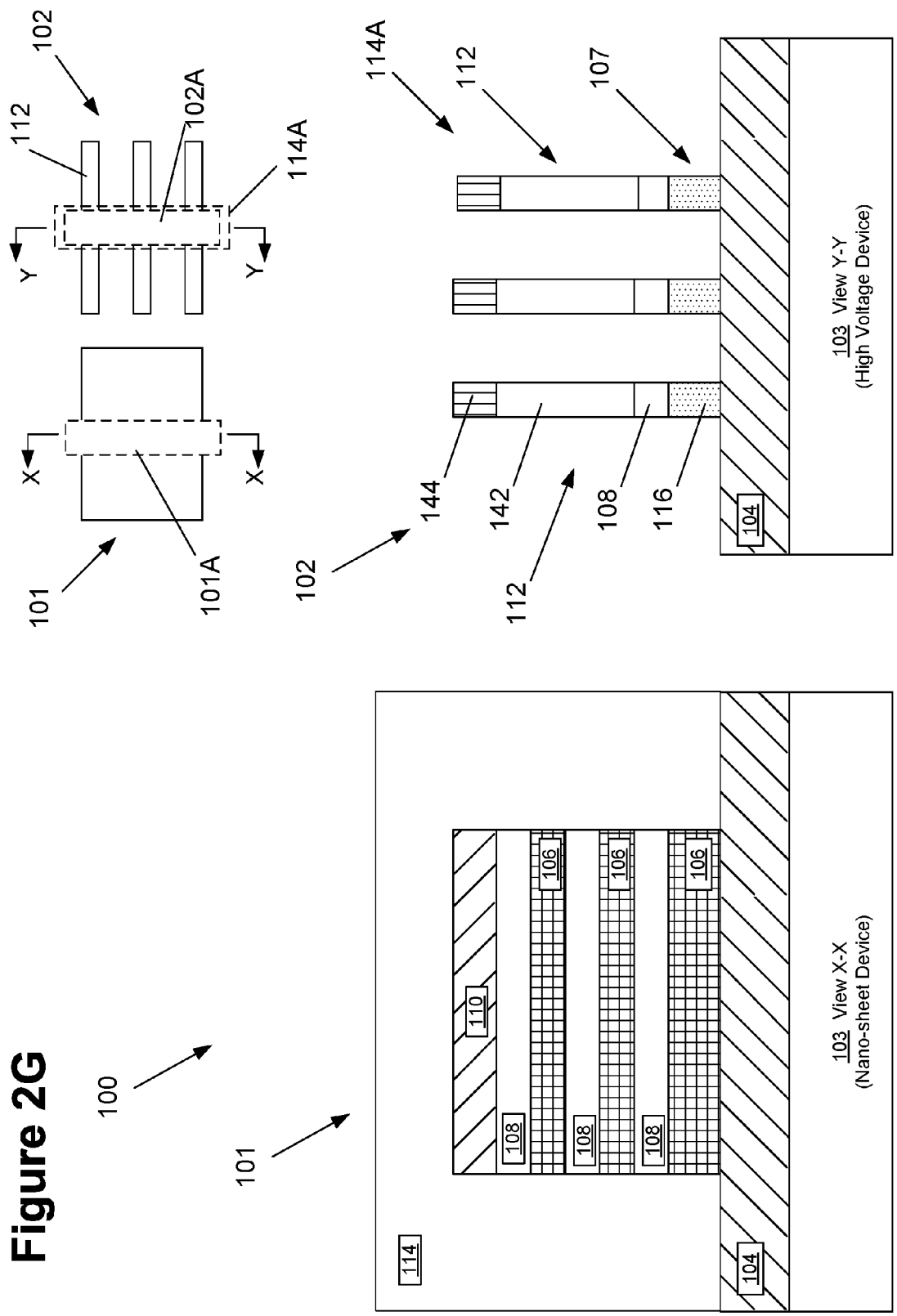

FIG. 2G depicts the product 100 after several process operations were performed. First, the above-described layer of insulating material 116 (e.g., silicon dioxide) was initially formed on the product 100 as shown in FIG. 1D. Then, as shown in FIG. 1E, the above-described anisotropic etching process was performed on the layer of insulating material 116. At the completion of this etching process, portions of the layer of insulating material 116 remain positioned in the space 107 between the semiconductor material 108 and the insulation material 104.

FIG. 2H depicts the product 100 after several process operations were performed. First, the patterned masking layer 114 was removed, thereby exposing both the nano-sheet device 101 and the device 102. Then, as shown in FIG. 1F, the above-described patterned masking layer 118 (not shown in FIG. 2H) with a plurality of openings 118A (see plan view of FIG. 1F) was formed on the product 100 and the etching process was performed through the openings 118A in the patterned masking layer 118 to remove the portions of the layers of the semiconductor materials 106, 108 positioned under the openings 118A as described above with reference to FIG. 1F. Then, the patterned masking layer 118 was removed so as to thereby expose both the nano-sheet device 101 and the device 102. Thereafter, the above-described conformal layer of insulating material 120 was formed on both the nano-sheet device 101 and the device 102.

Figure 2I:
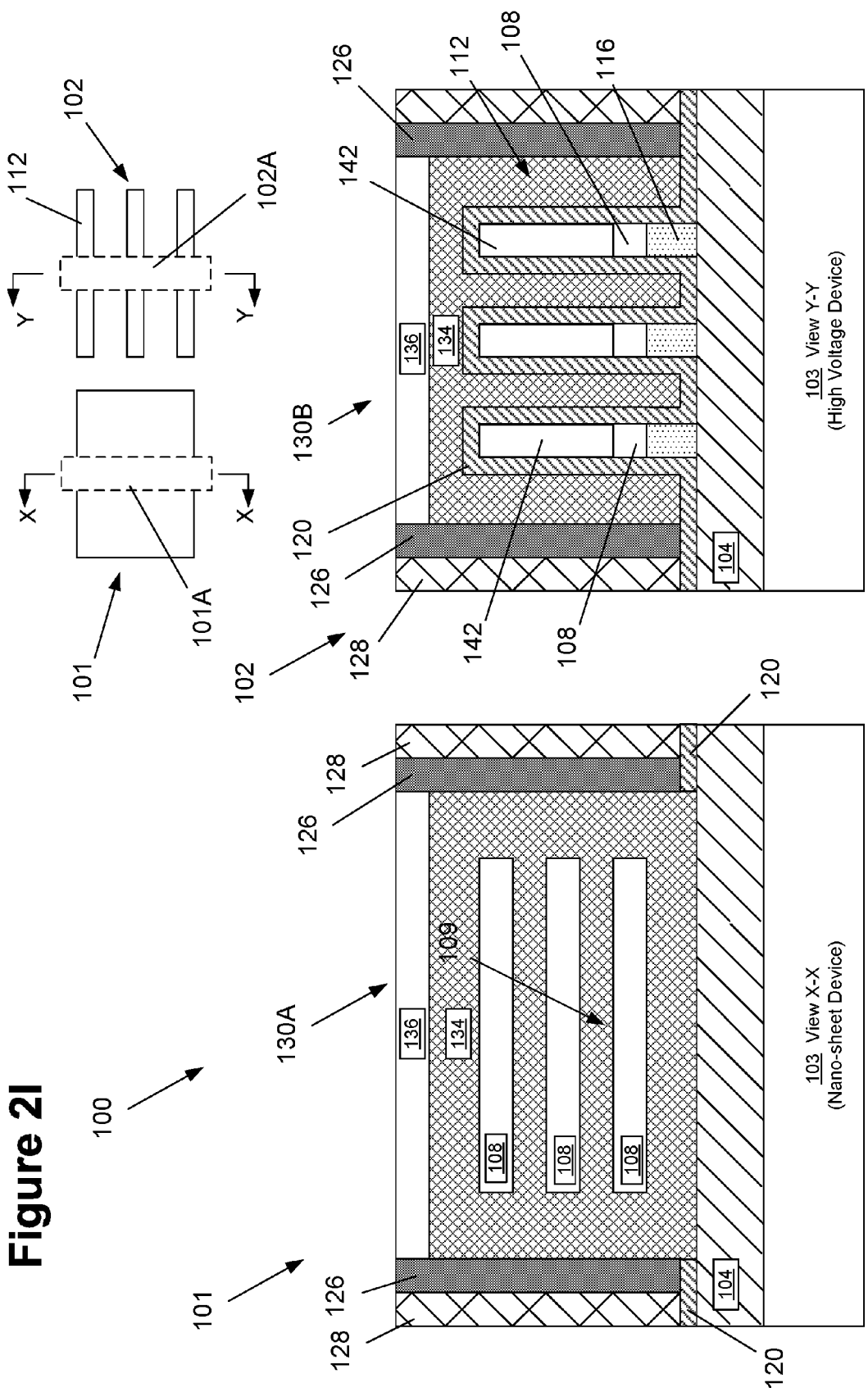

FIG. 2I depicts the product 100 after several process operations were performed. First, the above-described sacrificial gate structure 122, a gate cap layer 124 and a sidewall spacer 126 were formed for both the nano-sheet device 101 and the device 102, as shown in FIG. 1H. Next, the process operations described above in connection with FIG. 1I were performed so as to form the above-described layer of insulating material 128 and expose the sacrificial gate structures 122 so that they can be removed. Next, the process operations described in connection with FIG. 1J were performed to remove the sacrificial gate structures 122 and thereby define the above-described replacement gate cavity 130A for the nano-sheet device 101 and the replacement gate cavity 130B for the device 102. Thereafter, the process operations described above in connection with FIG. 1K were performed. That is, the above-described patterned masking layer 132 was formed on the product 100 so as to cover the device 102 and expose the nano-sheet device 101 and the above-described etching process was performed through the patterned masking layer 132 to remove portions of the layer of insulating material 120 from within the gate cavity 130A of the nano-sheet device 101, i.e., to remove the relatively thick gate insulation layer material 120 for the device 102 from the nano-sheet device 101. As depicted in view Y-Y, the relatively thick gate insulation layer material 120 remains in position on the device 102. Next, the process operations described in connection with FIG. 1L were performed through the patterned masking layer 132 to selectively remove the portions of the layers of the semiconductor material 106 in the gate cavity 130A relative to the layers of semiconductor material 108. This process operation results in the formation a plurality of vertically spaced-apart layers of the semiconductor material 108 within the gate cavity 130A for the nano-sheet device 101 with the above-described open spaces 109 therebetween in what will become the channel region for the nano-sheet device 101. Lastly, the process operations described in connection with FIG. 1M were performed to form the above-described replacement or final gate structures 134 and gate cap layers 136 in the gate cavities 130 for both the nano-sheet device 101 and the device 102.

Figure 3A:
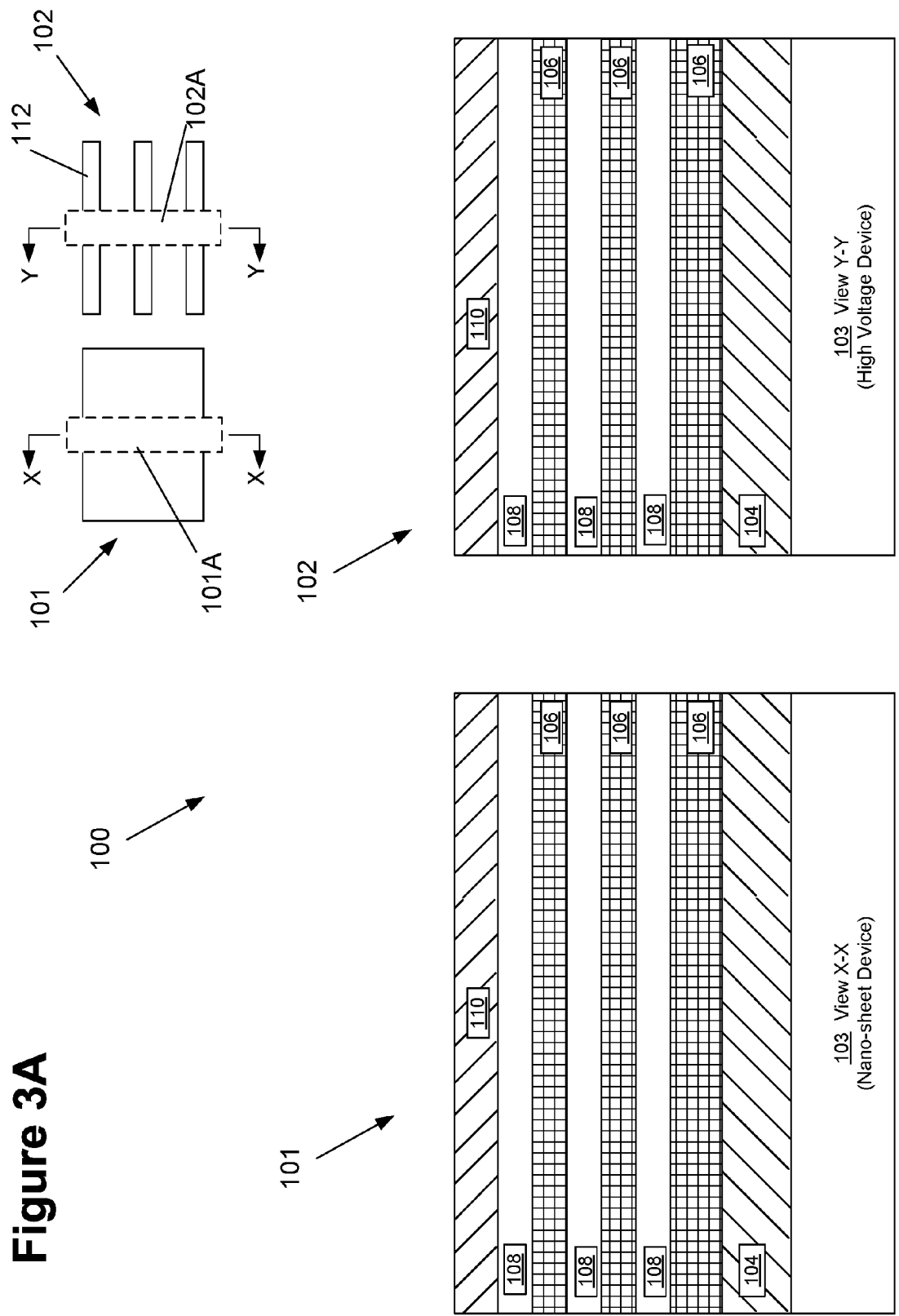

FIGS. 3A-3F depict yet other illustrative novel methods disclosed herein for forming an integrated circuit (IC) product comprising the nano-sheet device 101 and the device 102. FIG. 3A depicts the product 100 at a point that corresponds to that shown in FIG. 1A, i.e., after the layers of semiconductor materials 106, 108 and after the masking layer 110 were formed above the substrate 103.

Figure 3B:
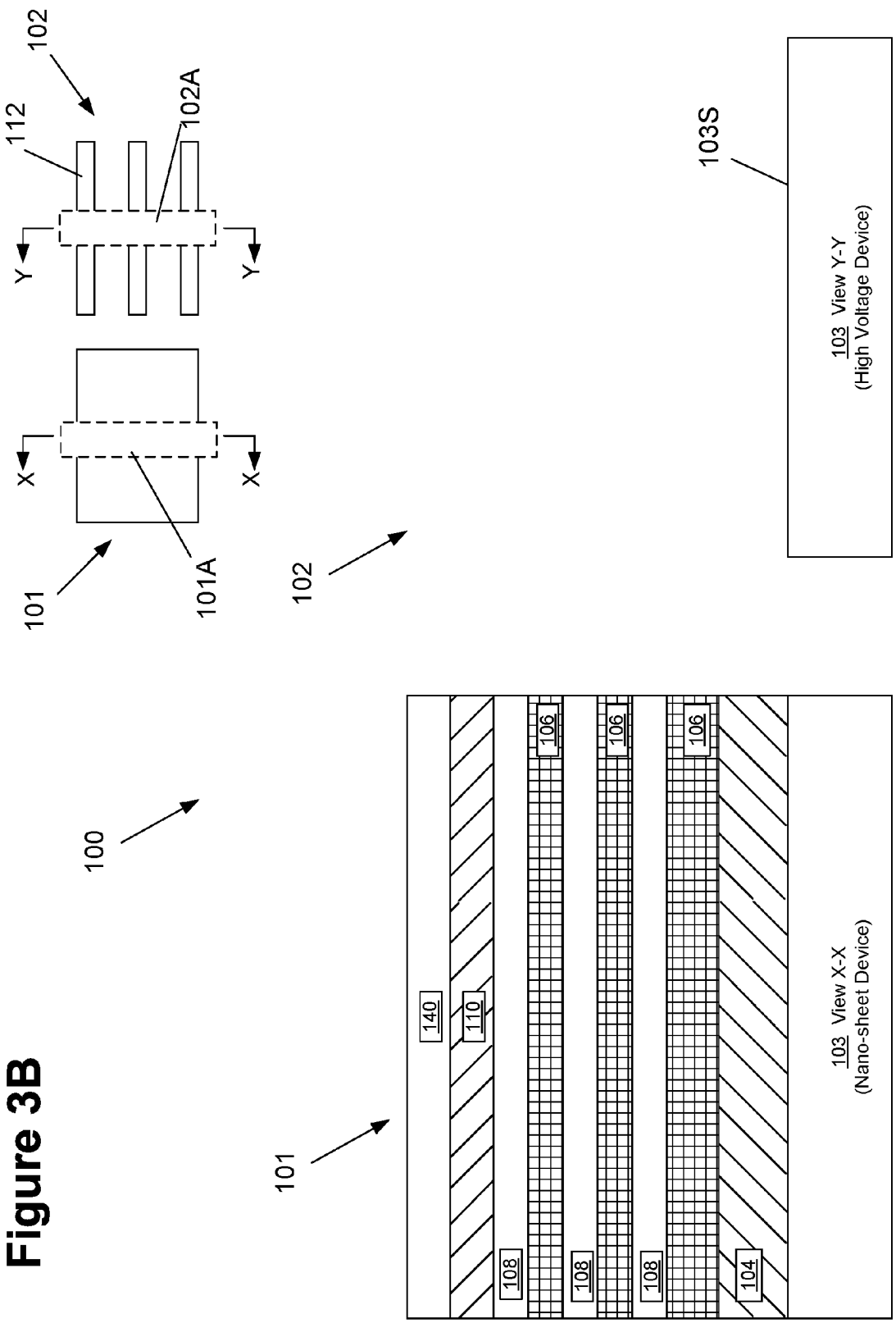

FIG. 3B depicts the product 100 after several process operations were performed. First, the above-described patterned masking layer 140, e.g., a photomask, OPL, etc., was formed that covers the nano-sheet device 101 but exposes the device 102. Then, one or more etching processes were performed through the patterned masking layer 140 to remove exposed portions of the masking layer 110, all of the layers of the semiconductor materials 106, 108 and the exposed portion of the layer of insulating material 104. These process operations ultimately result in the exposure of the upper surface 103S of the bulk substrate of the starting SOI structure.

Figure 3C:
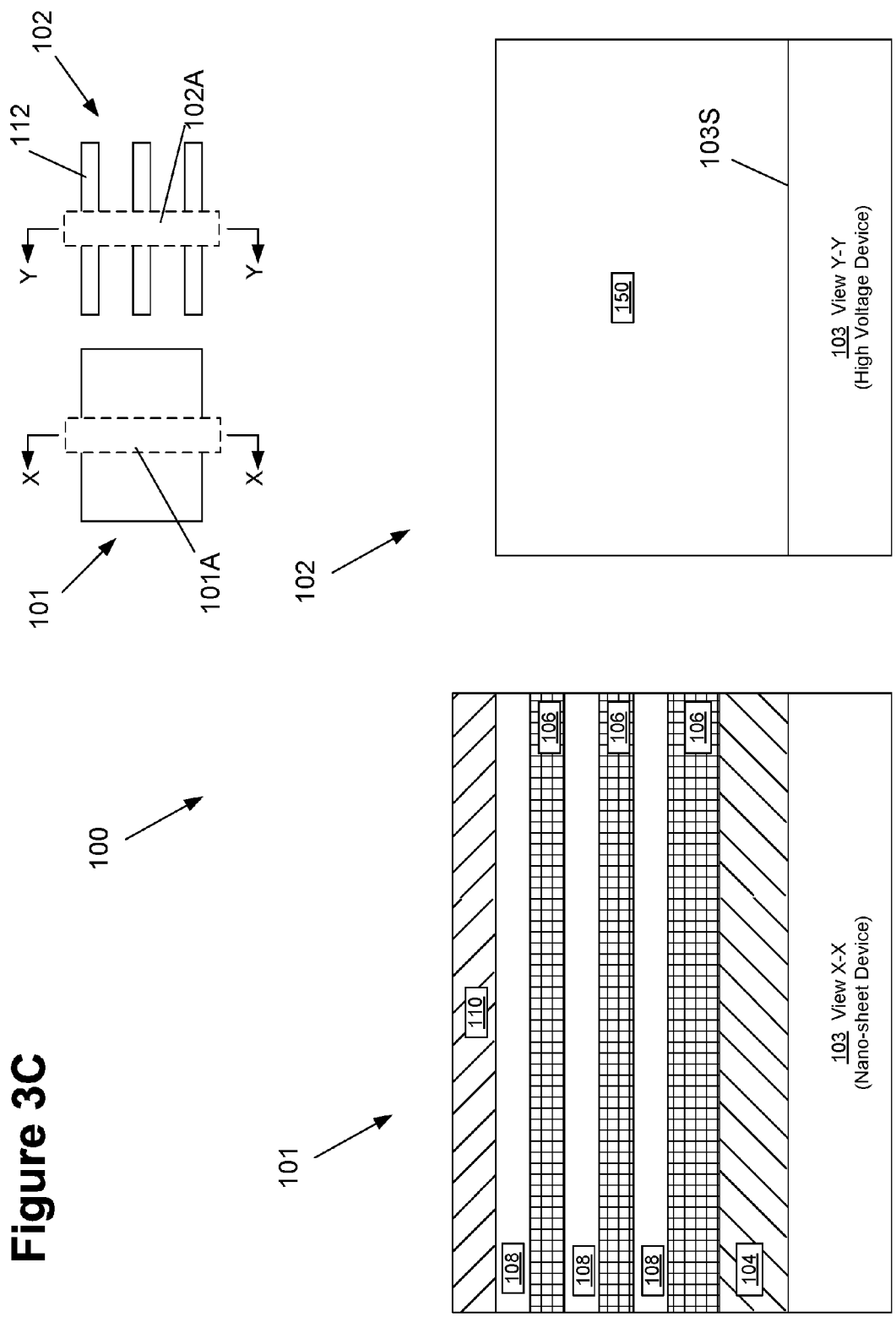

FIG. 3C depicts the product 100 after several process operations were performed. First, the patterned masking layer 140 was removed. Thereafter, an epitaxial deposition process was performed to grow a layer of channel semiconductor material 150 on the exposed surface 103S of the substrate 103. In one illustrative embodiment, the semiconductor material 150 may be made of the same material as that of the substrate 103, but that may not be the case in all applications.

FIG. 3D depicts the product after the above-described masking layer 144 was formed above the semiconductor material 150 for the device 102.

Figure 3E:
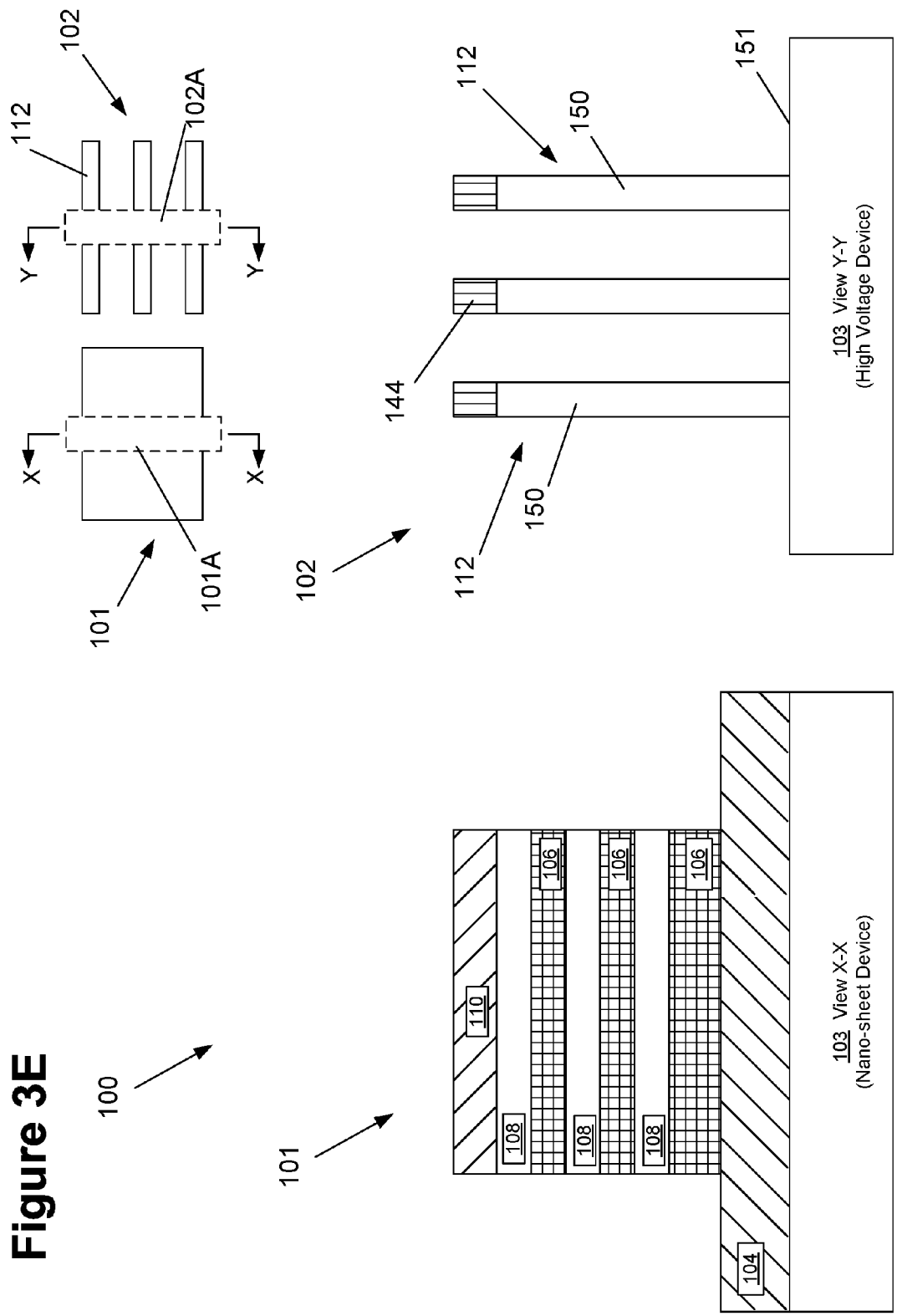

FIG. 3E depicts the product 100 after the above-described process operations performed in FIG. 1B were performed, e.g., after the basic fin structures 112 were formed. However, at this point in the process flow in this embodiment, the fins 112 comprise the semiconductor material 150 and not the semiconductor materials 106, 108. Depending upon the depth of the trenches 151, the fins 112 may also comprise a portion of the substrate 103.

FIG. 3F depicts the product 100 after several process operations were performed. First, as shown in FIG. 1F, the above-described patterned masking layer 118 (not shown in FIG. 3F) with a plurality of openings 118A (see plan view of FIG. 1F) was formed on the product 100. Then, an etching process was performed through the openings 118A in the patterned masking layer 118 to remove exposed portions of the layers of the semiconductor materials 106, 108 as described above with reference to FIG. 1F (with the understanding that, in this embodiment, the semiconductor materials 106, 108 are not part of the fins 112). Then, the patterned masking layer 118 was removed so as to thereby expose both the nano-sheet device 101 and the device 102. Thereafter, the above-described conformal layer of insulating material 120 was formed on both the nano-sheet device 101 and the device 102.

With continuing reference to FIG. 3F, the above-described sacrificial gate structure 122, a gate cap layer 124 and a sidewall spacer 126 were then formed for both the nano-sheet device 101 and the device 102, as shown in FIG. 1H. Next, the process operations described above in connection with FIG. 1I were performed so as to form the above-described layer of insulating material 128 and expose the sacrificial gate structures 122 so that they can be removed. Thereafter, the process operations described in connection with FIG. 1J were performed to remove the sacrificial gate structures 122 and thereby define the above-described replacement gate cavity 130A for the nano-sheet device 101 and the replacement gate cavity 130B for the device 102. At that point, the process operations described above in connection with FIG. 1K were performed. That is, the above-described patterned masking layer 132 was formed on the product 100 so as to cover the device 102 and expose the nano-sheet device 101 and the above-described etching process was performed through the patterned masking layer 132 to remove portions of the layer of insulating material 120 from within the gate cavity 130A of the nano-sheet device 101, i.e., to remove the relatively thick gate insulation layer material 120 for the device 102 from the nano-sheet device 101. As depicted in view Y-Y, the relatively thick gate insulation layer material 120 remains in position on the device 102. Next, the process operations described in connection with FIG. 1L were performed through the patterned masking layer 132 to selectively remove the portions of the layers of the semiconductor material 106 in the gate cavity 130A relative to the layers of semiconductor material 108. This process operation results in the formation of a plurality of vertically spaced-apart layers of the semiconductor material 108 within the gate cavity 130A for the nano-sheet device 101 with the above-described open spaces 109 therebetween in what will become the channel region for the nano-sheet device 101. Lastly, the process operations described in connection with FIG. 1M were performed to form the above-described replacement or final gate structures 134 and gate cap layers 136 in the gate cavities 130 for both the nano-sheet device 101 and the device 102.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. As used herein, spatial references "top," "bottom," "upper," "lower," "vertical," "horizontal" and the like may be used for convenience when referring to structures of FET devices. These references are intended to be used in a manner consistent with the drawings only for teaching purposes, and are not intended as absolute references for FET structures. For example, FETs may be oriented spatially in any manner different from the orientations shown in the drawings. Accordingly, the protection sought herein is as set forth in the claims below.

What is claimed:

1. A method of forming a nano-sheet device and a transistor device, comprising:
    forming channel semiconductor material for said nano-sheet device and channel semiconductor material for said transistor device;
    forming a device gate insulation layer on said nano-sheet device and on said transistor device;
    forming a first sacrificial gate structure for said nano-sheet device above said device gate insulation layer and a second sacrificial gate structure for said transistor device above said device gate insulation layer;
    removing said first and second sacrificial gate structures so as to define, respectively, a first gate cavity for said nano-sheet device and a second gate cavity for said transistor device, wherein said device gate insulation layer is exposed within each of said first and second gate cavities;
    removing said device gate insulation layer from within said first gate cavity while leaving said device gate insulation layer in position within said second gate cavity;
    forming a first replacement gate structure in said first gate cavity; and
    forming a second replacement gate structure in said second gate cavity above said device gate insulation layer.

2. The method of claim 1, wherein forming said channel semiconductor material for said nano-sheet device and said channel semiconductor material for said transistor device comprises:
    forming at least one layer of a first semiconductor material and at least one layer of a second semiconductor material above a substrate, wherein said first and second semiconductor materials are arranged in alternating fashion and wherein said first and second semiconductor materials are comprised of materials that may be selectively etched relative to one another; and
    patterning said layers of said first and second semiconductor materials so as to define a fin comprising said first and second semiconductor materials for said transistor device and a stack of said first and second semiconductor materials for said nano-sheet device.

3. The method of claim 2, wherein, prior to forming said device gate insulation layer, the method further comprises:
    forming a patterned masking layer that covers said nano-sheet device and exposes a portion of said fin of said transistor device where a channel region of said transistor device will be formed;
    while masking said nano-sheet device, selectively removing said at least one layer of said first semiconductor material from said exposed portion of said fin while leaving said at least one layer of said second semiconductor material in said exposed portion of said fin intact; and
    forming an insulating material in a space formerly occupied by said removed at least one layer of said first semiconductor material in said exposed portion of said fin.

4. The method of claim 2, further comprising:
    forming a patterned masking layer that covers said nano-sheet device and exposes a portion of said fin of said transistor device where a channel region of said transistor device will be formed; and
    while masking said nano-sheet device, selectively removing said at least one layer of said first semiconductor material from said exposed portion of said fin while leaving said at least one layer of said second semiconductor material in said exposed portion of said fin intact.

5. The method of claim 4, wherein forming said device gate insulation layer on said nano-sheet device and on said transistor device comprises forming said device gate insulation layer in a space formerly occupied by said removed at least one layer of said first semiconductor material in said exposed portion of said fin.

6. The method of claim 1, wherein said first and second replacement gate structures comprise a high-k gate insulation layer and at least one layer of metal, wherein said transistor device is a high voltage transistor device, and wherein said nano-sheet device is designed for operating at a lower operating voltage than an operating voltage of said high voltage transistor device.

7. The method of claim 1, wherein forming said channel semiconductor material for said nano-sheet device and said channel semiconductor material for said transistor device comprises:
    forming a plurality of layers of a first semiconductor material and a plurality of layers of a second semiconductor material above a substrate, wherein said layers of said first and second semiconductor materials are arranged in alternating fashion and wherein said first and second semiconductor materials are comprised of materials that may be selectively etched relative to one another; and
    patterning said layers of said first and second semiconductor materials so as to define a fin for said transistor devices comprising said plurality of layers of said first semiconductor material and said plurality of layers of said second semiconductor material and a stack of materials for said nano-sheet device, wherein said stack of materials comprises said plurality of layers of said first semiconductor material and said plurality of layers of said second semiconductor material.

8. The method of claim 7, wherein, prior to forming said device gate insulation layer, the method further comprises:
forming a patterned masking layer that covers said nano-sheet device and exposes a portion of said fin of said transistor device where a channel region of said transistor device will be formed;
while masking said nano-sheet device, selectively removing all of said plurality of layers of said first semiconductor material from said exposed portion of said fin while leaving all of said layers of said second semiconductor material in said exposed portion of said fin intact; and
forming an insulating material in a space formerly occupied by said removed layers of said first semiconductor material in said exposed portion of said fin.

9. The method of claim 7, wherein, prior to forming said device gate insulation layer, the method further comprises:
forming a patterned masking layer that covers said nano-sheet device and exposes a portion of said fin of said transistor device where a channel region of said transistor device will be formed;
while masking said nano-sheet device, performing at least one selective etching process so as to selectively remove at least one of said plurality of layers of said first semiconductor material and at least one of said plurality of layers of said second semiconductor material from said exposed portion of said fin while leaving at least one layer of said first semiconductor material and at least one layer of said second semiconductor material in said exposed portion of said fin intact; and
forming a third semiconductor material on said at least one layer of said second semiconductor material in said exposed portion of said fin.

10. The method of claim 9, wherein said second and third semiconductor materials comprise a same semiconductor material.

11. The method of claim 7, wherein, prior to forming said device gate insulation layer, the method further comprises:
forming a patterned masking layer that covers said nano-sheet device and exposes a portion of said fin of said transistor device where a channel region of said transistor device will be formed;
while masking said nano-sheet device, performing at least one selective etching process so as to selectively remove all of said plurality of layers of said first semiconductor material and all of said plurality of said layers of said second semiconductor material from said exposed portion of said fin so as to expose a surface of said substrate;
forming a third semiconductor material on said exposed surface of said substrate in an area of said fin; and
patterning at least said third semiconductor material so as to define a fin in said channel region of said transistor device that comprises said third semiconductor material.

12. The method of claim 1, wherein said first semiconductor material is silicon germanium and said second semiconductor material is silicon.

13. A method of forming a nano-sheet device and a transistor device, comprising:
forming channel semiconductor material for said nano-sheet device and channel semiconductor material for said transistor device by:
forming at least one layer of a first semiconductor material and at least one layer of a second semiconductor material above a substrate, wherein said first and second semiconductor materials are arranged in alternating fashion and wherein said first and second semiconductor materials are comprised of materials that may be selectively etched relative to one another; and
patterning said layers of said first and second semiconductor materials so as to define a fin comprising said first and second semiconductor materials for said transistor device and a stack of said first and second semiconductor materials for said nano-sheet device;
forming a first patterned masking layer that covers said nano-sheet device and exposes a portion of said fin of said transistor device where a channel region of said transistor device will be formed;
while masking said nano-sheet device with said first patterned masking layer, performing a first selective etching process to selectively remove said at least one layer of said first semiconductor material from said exposed portion of said fin while leaving said at least one layer of said second semiconductor material in said exposed portion of said fin intact;
after performing said first selective etching process, performing a conformal deposition process to form a device gate insulation layer on said nano-sheet device and on said transistor device;
forming a first sacrificial gate structure for said nano-sheet device above said device gate insulation layer and a second sacrificial gate structure for said transistor device above said device gate insulation layer;
removing said first and second sacrificial gate structures so as to define, respectively, a first gate cavity for said nano-sheet device and a second gate cavity for said transistor device, wherein said device gate insulation layer is exposed within each of said first and second gate cavities;
removing said device gate insulation layer from within said first gate cavity while leaving said device gate insulation layer in position within said second gate cavity;
forming a first replacement gate structure in said first gate cavity; and
forming a second replacement gate structure in said second gate cavity above said device gate insulation layer.

14. The method of claim 13, wherein performing said conformal deposition process to form said device gate insulation layer on said nano-sheet device and on said transistor device comprises performing said conformal deposition process to form said device gate insulation layer in a space formerly occupied by said removed at least one layer of said first semiconductor material in said exposed portion of said fin.

15. The method of claim 13, wherein forming said at least one layer of said first semiconductor material and said at least one layer of said second semiconductor material above said substrate comprises forming a plurality of layers of said first semiconductor material and a plurality of layers of said second semiconductor material above said substrate, wherein said layers of said first and second semiconductor materials are arranged in alternating fashion and wherein said first and second semiconductor materials are comprised of materials that may be selectively etched relative to one another.

16. The method of claim 15, wherein patterning said layers of said first and second semiconductor materials comprises patterning said layers of said first and second semiconductor materials so as to define a fin for said transistor device comprising said plurality of said layers of said first semiconductor material and said plurality of said layers of said second semiconductor material and a stack of materials for said nano-sheet device, wherein said stack of materials comprises said plurality of layers of said first semiconductor material and said plurality of layers of said second semiconductor material.

17. The method of claim 16, wherein performing said first selective etching process comprises performing said first selective etching process so as to selectively remove all of said plurality of layers of said first semiconductor material from said exposed portion of said fin while leaving all of said layers of said second semiconductor material in said exposed portion of said fin intact.

18. The method of claim 16, wherein performing said first selective etching process comprises performing said first selective etching process so as to selectively remove at least one of said plurality of layers of said first semiconductor material and at least one of said plurality of layers of said second semiconductor material from said exposed portion of said fin while leaving at least one layer of said first semiconductor material and at least one layer of said second semiconductor material in said exposed portion of said fin intact.

19. The method of claim 18, further comprising forming a third semiconductor material on said at least one layer of said second semiconductor material in said exposed portion of said fin.

20. The method of claim 19, wherein said second and third semiconductor materials comprise a same semiconductor material.

21. The method of claim 16, wherein performing said first selective etching process comprises performing said first selective etching process so as to remove all of said plurality of layers of said first semiconductor material and all of said plurality of layers of said second semiconductor material from said exposed portion of said fin so as to expose a surface of said substrate.

22. The method of claim 21, further comprising:
forming a third semiconductor material on said exposed surface of said substrate in an area of said fin; and
patterning at least said third semiconductor material so as to define a fin in said channel region of said transistor device that comprises said third semiconductor material.

* * * * *